US012795892B2

(12) United States Patent
Liu et al.

(10) Patent No.: US 12,795,892 B2
(45) Date of Patent: Nov. 10, 2026

(54) THREE-DIMENSIONAL MEMORY DEVICE WITH ISOLATION STRUCTURE AND METHOD FOR FORMING THE SAME

(71) Applicant: YANGTZE MEMORY TECHNOLOGIES CO., LTD., Wuhan (CN)

(72) Inventors: Yaqin Liu, Wuhan (CN); Wei Liu, Wuhan (CN); Yanhong Wang, Wuhan (CN); Shiqi Huang, Wuhan (CN); Zichen Liu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 478 days.

(21) Appl. No.: 18/231,731

(22) Filed: Aug. 8, 2023

(65) Prior Publication Data

US 2024/0098973 A1 Mar. 21, 2024

Related U.S. Application Data

(60) Provisional application No. 63/408,030, filed on Sep. 19, 2022.

(30) Foreign Application Priority Data

Jul. 28, 2023 (CN) ......................... 202310944670.8

(51) Int. Cl.
*H10B 12/00* (2023.01)

(52) U.S. Cl.
CPC ....... *H10B 12/315* (2023.02); *H10B 12/0335* (2023.02); *H10B 12/05* (2023.02);
(Continued)

(58) Field of Classification Search
CPC .. H10B 12/315; H10B 12/0335; H10B 12/05; H10B 12/482; H10B 12/488; H10B 12/50
See application file for complete search history.

(56) References Cited

U.S. PATENT DOCUMENTS

2020/0411535 A1* 12/2020 Wang ..................... H10B 41/27
2023/0060149 A1* 3/2023 Zhu ........................ H10B 12/33
2023/0064388 A1* 3/2023 Liu ........................ H10B 12/50

FOREIGN PATENT DOCUMENTS

WO WO-2023029142 A1 * 3/2023 ......... H10D 30/6728

* cited by examiner

*Primary Examiner* — Ratisha Mehta
*Assistant Examiner* — Sophia W Kao
(74) *Attorney, Agent, or Firm* — BAYES PLLC

(57) ABSTRACT

A semiconductor device, a memory system, and a fabricating method are provided. The semiconductor device comprises a memory structure bonded with a circuit structure. The memory structure comprises: first transistors each comprising a semiconductor body extending in a vertical direction, a semiconductor layer on a lateral side of the first transistors, a first isolation structure extending through the semiconductor layer and laterally encircling a first portion of the semiconductor layer, a first contact structure extending through the first portion of the semiconductor layer, and a first contact pad above the first portion of the semiconductor layer and connected with the first contact structure. A lateral dimension of the first contact pad is less than a lateral dimension of the first portion of the semiconductor layer. The circuit structure comprises a second transistor, and the first contact pad is electrically connected to the second transistor by the first contact structure.

20 Claims, 22 Drawing Sheets

100

(52) U.S. Cl.
CPC ......... *H10B 12/482* (2023.02); *H10B 12/488* (2023.02); *H10B 12/50* (2023.02)

800

THREE-DIMENSIONAL MEMORY DEVICE WITH ISOLATION STRUCTURE AND METHOD FOR FORMING THE SAME

CROSS-REFERENCE TO RELATED APPLICATIONS

This application claims the benefit of priorities to C.N. Application No. 202310944670.8, filed Jul. 28, 2023, and U.S. Provisional Application No. 63/408,030, filed on Sep. 19, 2022, both of which are hereby incorporated by reference in their entireties.

TECHNICAL FIELD

The present disclosure generally relates to the field of semiconductor technology, and more particularly, to semiconductor devices and fabricating methods thereof.

BACKGROUND

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A three-dimensional (3D) memory architecture can address the density limitation in planar memory cells. The 3D memory architecture includes a memory array and peripheral circuits for facilitating operations of the memory array.

SUMMARY

In one aspect, a semiconductor device comprises a memory structure comprising: first transistors each comprising a semiconductor body extending in a vertical direction, a semiconductor layer on a lateral side of the first transistors, a first isolation structure extending through the semiconductor layer and laterally encircling a first portion of the semiconductor layer, a first contact structure extending through the first portion of the semiconductor layer, and a first contact pad above the first portion of the semiconductor layer and connected with the first contact structure, wherein a lateral dimension of the first contact pad is less than a lateral dimension of the first portion of the semiconductor layer; and a circuit structure comprising a second transistor, wherein circuit structure is bonded with the memory structure, the first contact pad is electrically connected to the second transistor by the first contact structure.

In some implementations, a lateral cross section of the first isolation structure is a ring.

In some implementations, the memory structure further comprises a second isolation structure extending through the semiconductor layer and laterally encircling a second portion of the semiconductor layer of the semiconductor layer; a second contact structure extending through the second portion of the semiconductor layer; and a second contact pad above the second portion of the semiconductor layer and connected with the second contact structure, wherein a lateral dimension of the second contact pad is less than a lateral dimension of the second portion of the semiconductor layer.

In some implementations, the first isolation structure is separated from the second isolation structure.

In some implementations, the first isolation structure and the second isolation structure share a common isolation wall.

In some implementations, the memory structure further comprises word lines each extending along a first lateral direction and comprising a plurality of gate structures of a row of the first transistors arranged in the first lateral direction; and bit lines each extending along a second lateral direction different from the first lateral direction and connected to a column of the first transistors arranged in the second lateral direction.

In some implementations, the memory structure further comprises storage units each connected with a corresponding first transistor.

In some implementations, the storage units are capacitors.

In some implementations, first transistor comprises a vertical semiconductor body, the vertical semiconductor body comprising: a first end connected with one storage unit; and a second end connected with one bit line.

In some implementations, the memory structure further comprises a third contact structure extending through the semiconductor layer outside the first isolation structure, and connected with a conductive layer in electric connection with the storage units.

In another aspect, a method of forming a semiconductor device comprises: forming a memory structure, comprising: forming first transistors on a lateral side of a semiconductor layer, forming a first isolation structure extending through in the semiconductor layer to laterally encircle a first portion of the semiconductor layer, and forming a first contact structure extending through the first portion of the semiconductor layer; and bonding a circuit structure to the memory structure comprising a transistor, such that the first contact structure is coupled to a second transistor in the circuit structure.

In some implementations, the method further comprises forming a first contact pad above the first portion of the semiconductor layer and connected with the first contact structure, wherein a lateral dimension of the first contact pad is less than a lateral dimension of the first portion of the semiconductor layer.

In some implementations, forming the memory structure further comprises removing a portion of a semiconductor substrate to separate the semiconductor layer from the first transistors.

In some implementations, forming the first isolation structure comprises forming the first isolation structure vertically extending through the semiconductor layer and laterally encircling the first portion of the semiconductor layer, the first portion of the semiconductor layer is isolated from other portions of the semiconductor layer outside the first isolation structure.

In some implementations, the method further comprises removing a portion of a semiconductor substrate to separate the semiconductor layer from the first transistors, and to separate the first portion of the semiconductor layer encircled by the first isolation structure from other portions of the semiconductor layer outside the first isolation structure.

In some implementations, the method further comprise forming a second isolation structure vertically extending through the semiconductor layer to laterally encircle a second portion of the semiconductor layer from other portions of the semiconductor layer; forming a second contact structure extending through the second portion of the semiconductor layer; and forming a second contact pad above the second portion of the semiconductor layer and connected with the second contact structure, wherein a lateral dimension of the second contact pad is less than a lateral dimension of the second portion of the semiconductor layer.

In some implementations, the first isolation structure and the second isolation structure are formed in a same first process; and the first contact and the second contact structure are formed in a same second process; and the first contact pad and the second contact pad are formed in a same third process.

In some implementations, the method further comprises the first isolation structure and the second isolation structure are formed to share a common isolation wall.

In some implementations, the method further comprises forming storage units connected with the first transistors; and forming a third contact structure extending through the semiconductor layer and outside the first isolation structure, and connected with a conductive layer in electric connection with the storage units, wherein the first contact structure and the third contact structure are formed in a same process.

In another aspect, a memory system comprises a memory device including a memory structure coupled with a circuit structure, wherein: the memory structure comprises: first transistors each comprising a semiconductor body extending in a vertical direction, a semiconductor layer on a lateral side of the first transistors, an isolation structure extending through the semiconductor layer and laterally encircling a portion of the semiconductor layer, a contact extending through the portion of the semiconductor layer encircled by the isolation structure, and a contact pad above the portion of the semiconductor layer and connected with the contact, wherein a lateral dimension of the contact pad is less than a lateral dimension of the portion of the semiconductor layer; the circuit structure comprises a second transistor electrically connected to the contact pad by the contact; and a memory controlled connected to the contact pad and configured to control the memory device through the contact pad.

BRIEF DESCRIPTION OF THE DRAWINGS

The accompanying drawings, which are incorporated herein and form a part of the specification, illustrate aspects of the present disclosure and, together with the description, further serve to explain the principles of the present disclosure and to enable a person skilled in the pertinent art to make and use the present disclosure.

Figure 1:
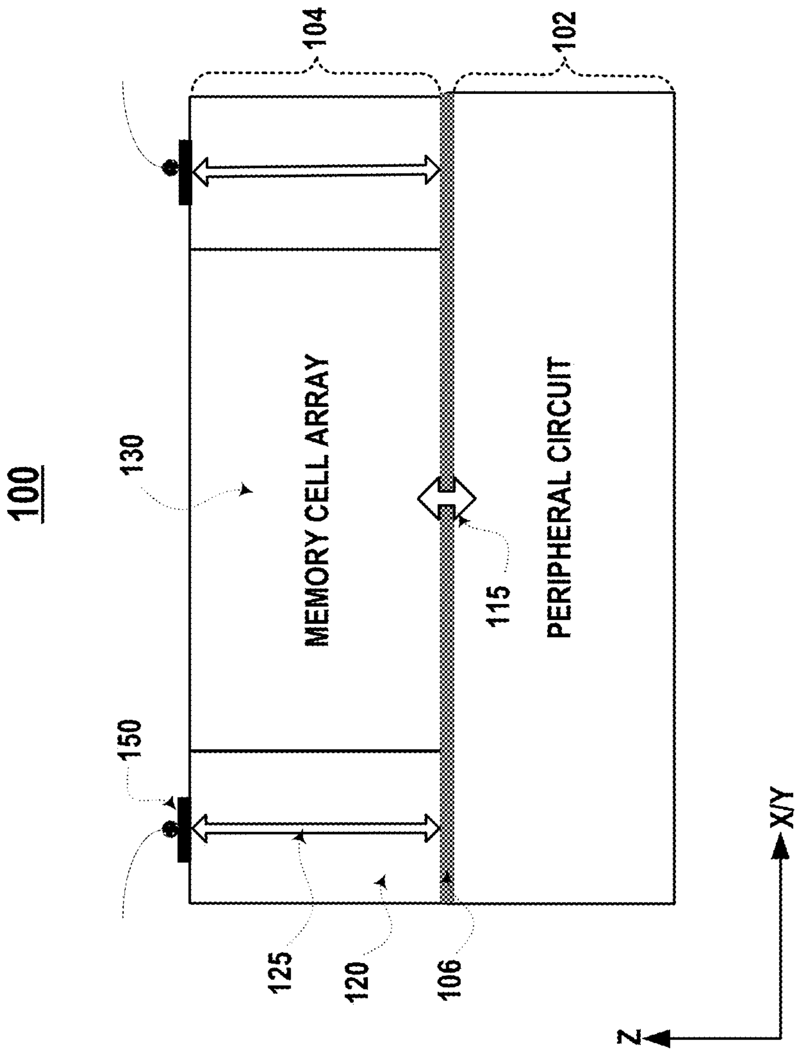
FIG. 1 illustrates a schematic view of a cross-section of a 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features, as described in the present disclosures can be combined, adjusted, and modified with one another and in ways not specifically depicted in the drawings, such that these combinations, adjustments, and modifications are within the scope of the present disclosure.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layers thereupon, thereabove, and/or therebelow. A layer can include multiple layers. For example, an interconnect layer can include one or more conductors and contact layers (in which interconnect lines and/or vertical interconnect access (via) contacts are formed) and one or more dielectric layers.

Transistors are used as the switch or selecting devices in the memory cells of some memory devices, such as DRAM, PCM, and ferroelectric DRAM (FRAM). However, the planar transistors commonly used in existing memory cells usually have a horizontal structure with buried word lines in the substrate and bit lines above the substrate. Since the source and drain of a planar transistor are disposed laterally at different locations, which increases the area occupied by the transistor. The design of planar transistors also complicates the arrangement of interconnected structures, such as word lines and bit lines, coupled to the memory cells, for example, limiting the pitches of the word lines and/or bit lines, thereby increasing the fabrication complexity and reducing the production yield. Moreover, because the bit lines and the storage units (e.g., capacitors or PCM elements) are arranged on the same side of the planar transistors (above the transistors and substrate), the bit line process margin is limited by the storage units, and the coupling capacitance between the bit lines and storage units, such as capacitors, are increased. Planar transistors may also suffer from a high leakage current as the saturated drain current keeps increasing, which is undesirable for the performance of memory devices.

On the other hand, the memory cell array and the peripheral circuits for controlling the memory cell array are usually arranged side-by-side in the same plane. As the number of memory cells keeps increasing, to maintain the same chip size, the dimensions of the components in the memory cell array, such as transistors, word lines, and/or bit lines, need to keep decreasing in order not to significantly reduce the memory cell array efficiency.

To address one or more of the aforementioned issues, the present disclosure introduces a solution in which vertical transistors replace the conventional planar transistors as the switch and selecting devices in a memory cell array of memory devices (e.g., DRAM, PCM, and FRAM). Compared with planar transistors, the vertically arranged transistors (i.e., the drain and source are overlapped in the plan view) can reduce the area of the transistor as well as simplify the layout of the interconnect structures, e.g., metal wiring the word lines and bit lines, which can reduce the fabrication complexity and improve the yield. For example, the pitches of word lines and/or bit lines can be reduced for ease of fabrication. The vertical structures of the transistors also allow the bit lines and storage units, such as capacitors, to be arranged on opposite sides of the transistors in the vertical direction (e.g., one above and one below the transistors), such that the process margin of the bit lines can be increased and the coupling capacitance between the bit lines and the storage units can be decreased.

Consistent with the scope of the present disclosure, according to some aspects of the present disclosure, the memory cell array having vertical transistors and the peripheral circuits of the memory cell array can be formed on different wafers. In some implementations, the silicon substrate of the memory array wafer can be thinned to expose the drain terminals, and then ion implantation and metal interconnection are carried out to bond the memory array wafer with the peripheral circuit wafer. Thus, the thermal budget for fabricating the memory cell array does not affect the fabrication of the peripheral circuits. The stacked memory cell array and peripheral circuits can also reduce the chip size compared with the side-by-side arrangement, thereby improving the array efficiency.

Consistent with the scope of the present disclosure, according to some aspects of the present disclosure, contact pads can be formed on the memory array wafer. Due to the limited transistor height, there is a capacitance of I/O port (CIO) between the contact pads and the silicon substrate of the memory array wafer, which reduces the input/output (I/O) speed of the memory devices. In the disclosed memory device, one or more through silicon isolation (TSI) rings can be formed in the silicon region below the contact pads (e.g., metal pads), so that the silicon below the contact pads can be separated from the silicon substrate of the memory array wafer. By adjusting the width, size, and number of TSI rings, the CIO between the contact pads and the silicon substrate can be reduced, thereby increasing the I/O speed and improving the performance of DRAM.

FIG. 1 illustrates a schematic view of a cross-section of a 3D memory device 100, according to some aspects of the present disclosure. 3D memory device 100 represents an example of a bonded chip. The components of 3D memory device 100 (e.g., memory cell array and peripheral circuits) can be formed separately on different substrates and then jointed to form a bonded chip. 3D memory device 100 can include a first semiconductor structure 102 including the peripheral circuits of a memory cell array, also referred to as a circuit structure. 3D memory device 100 can also include a second semiconductor structure 104 including the memory cell array, also referred to as a memory structure. The peripheral circuits (a.k.a. control and sensing circuits) can include any suitable digital, analog, and/or mixed-signal circuits used for facilitating the operations of the memory cell array. For example, the peripheral circuit can include one or more of a page buffer, a decoder (e.g., a row decoder and a column decoder), a sense amplifier, a driver (e.g., a word line driver), an input/output (I/O) circuit, a charge pump, a voltage source or generator, a current or voltage reference, any portions (e.g., a sub-circuit) of the functional circuits mentioned above, or any active or passive components of the circuit (e.g., transistors, diodes, resistors, or capacitors). The peripheral circuits in first semiconductor structure 102 use complementary metal-oxide-semiconductor (CMOS) technology, e.g., which can be implemented with logic processes (e.g., technology nodes of 90 nm, 65 nm, 60 nm, 45 nm, 32 nm, 28 nm, 22 nm, 20 nm, 16 nm, 14 nm, 10 nm, 7 nm, 5 nm, 3 nm, 2 nm, etc.), according to some implementations.

In some implementations, the second semiconductor structure 104 can include an array of memory cells (memory cell array 130) that can use transistors as the switch and selecting devices. In some implementations, memory cell array 130 includes an array of DRAM cells. For ease of description, a DRAM cell array may be used as an example for describing the memory cell array 130 in the present disclosure. But it is understood that the memory cell array 130 is not limited to DRAM cell array and may include any other suitable types of memory cell arrays that can use transistors as the switch and selecting devices, such as PCM cell array, static random-access memory (SRAM) cell array, FRAM cell array, resistive memory cell array, magnetic memory cell array, spin transfer torque (STT) memory cell array, to name a few, or any combination thereof.

In some implementations, the second semiconductor structure 104 can be a DRAM device in which memory cells are provided in the form of an array of DRAM cells. In some embodiments, each DRAM cell includes a capacitor for storing a bit of data as a positive or negative electrical charge as well as one or more transistors (a.k.a. pass transistors) that control (e.g., switch and selecting) access to it. In some implementations, each DRAM cell is a one-transistor, one-capacitor (1T1C) cell. Since transistors always leak a small amount of charge, the capacitors will slowly discharge, causing information stored in them to drain. As such, a DRAM cell has to be refreshed to retain data, for example, by the peripheral circuit in first semiconductor structure 102, according to some implementations.

As shown in FIG. 1, 3D memory device 100 further includes a bonding interface 106 vertically between (in the vertical direction, e.g., the z-direction in FIG. 1) first semiconductor structure 102 and second semiconductor structure 104. As described below in detail, first and second semiconductor structures 102 and 104 can be fabricated separately (and in parallel in some implementations) such that the thermal budget of fabricating one of first and second semiconductor structures 102 and 104 does not limit the processes of fabricating another one of first and second semiconductor structures 102 and 104. Moreover, a large number of interconnects 115 (e.g., bonding contacts) can be formed through bonding interface 106 to make direct, short-distance (e.g., micron-level) electrical connections between first semiconductor structure 102 and second semiconductor structure 104, as opposed to the long-distance (e.g., millimeter or centimeter-level) chip-to-chip data bus on the circuit board, such as printed circuit board (PCB), thereby eliminating chip interface delay and achieving high-speed I/O throughput with reduced power consumption. Data transfer between the memory cell array in second semiconductor structure 104 and the peripheral circuits in first semiconductor structure 102 can be performed through the interconnects 115 (e.g., bonding contacts) across bonding interface 106. By vertically integrating first and second semiconductor structures 102 and 104, the chip size can be reduced, and the memory cell density can be increased.

In some implementations as shown in FIG. 1, the second semiconductor structure 104 can further include one or more contact regions 120 at one or more sides of the memory cell array 130. One or more contacts 125 can extend vertically through the one or more contact regions 120. A first end of each contact 125 can be electrically connected to a corresponding interconnect 115 or any other interconnect structure in the second semiconductor structure 104. A second end of each contact 125 can be electrically connected to a contact pad 150 through a pad-out interconnect layer (not shown). In some implementations, the pad-out interconnect layer and the contact pads 150 can transfer electrical signals between 3D memory device 100 and outside circuits, e.g., for pad-out purposes.

It is understood that the relative positions of stacked first and second semiconductor structures 102 and 104 are not limited. Bonding interface 106 is formed vertically between first and second semiconductor structures 102 and 104 in 3D memory device 100, and first and second semiconductor structures 102 and 104 are jointed vertically through bonding (e.g., hybrid bonding) according to some implementations. Hybrid bonding, also known as "metal/dielectric hybrid bonding," is a direct bonding technology (e.g., forming bonding between surfaces without using intermediate layers, such as solder or adhesives) and can obtain metal-metal (e.g., copper-to-copper) bonding and dielectric-dielectric (e.g., silicon oxide-to-silicon oxide) bonding simultaneously. Data transfer between the memory cell array in second semiconductor structure 104 and the peripheral circuits in first semiconductor structure 102 can be performed through the interconnects (e.g., bonding contacts) across bonding interface 106.

It is noted that x, y, and z axes are included in FIG. 1 to further illustrate the spatial relationship of the components in 3D memory devices 100. The substrate of the 3D memory device includes two lateral surfaces extending laterally in the x-y plane: a top surface on the front side of the wafer on which the semiconductor devices can be formed, and a bottom surface on the backside opposite to the front side of the wafer. The z-axis is perpendicular to both the x and y axes. As used herein, whether one component (e.g., a layer or a device) is "on," "above," or "below" another component (e.g., a layer or a device) of the 3D memory device is determined relative to the substrate of the 3D memory device in the z-direction (the vertical direction perpendicular to the x-y plane, e.g., the thickness direction of the substrate) when the substrate is positioned in the lowest plane of the 3D memory device in the z-direction. The same notion for describing the spatial relationships is applied throughout the present disclosure.

Figure 2:
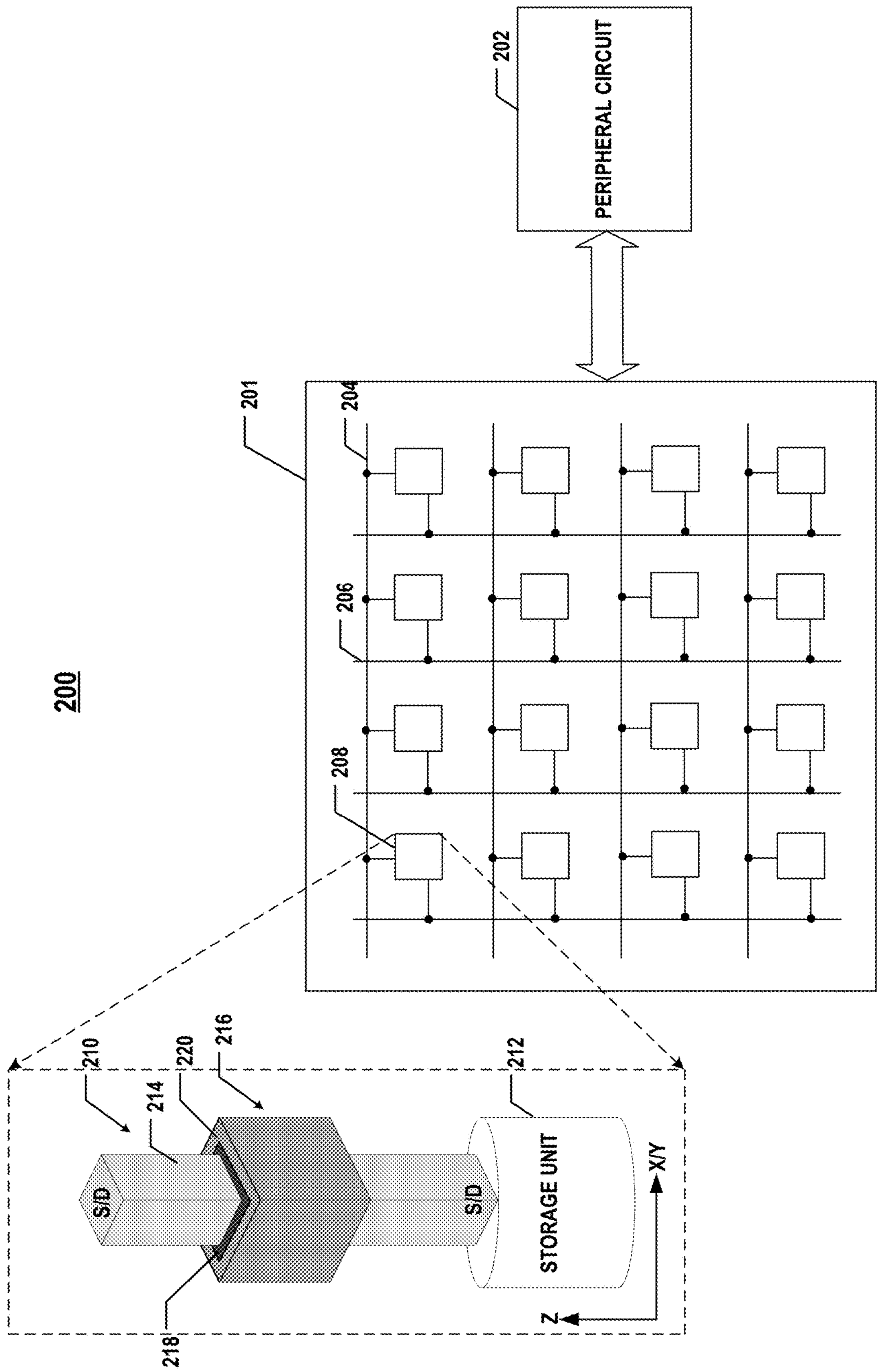
FIG. 2 illustrates a schematic diagram of a memory device including peripheral circuits and an array of memory cells, according to some aspects of the present disclosure.

FIG. 2 illustrates a schematic diagram of a memory device 200 including peripheral circuits and an array of memory cells each having a vertical transistor, according to some aspects of the present disclosure. Memory device 200 can include a memory cell array 201 and peripheral circuits 202 coupled to memory cell array 201. 3D memory device 100 may be examples of memory device 200 in which memory cell array 201 and peripheral circuits 202 may be included in second and first semiconductor structures 104 and 102, respectively. Memory cell array 201 can be any suitable memory cell array in which each memory cell 208 includes a vertical transistor 210 and a storage unit 212 coupled to vertical transistor 210. In some implementations, memory cell array 201 is a DRAM cell array, and storage unit 212 is a capacitor for storing charge as the binary information stored by the respective DRAM cell. In some implementations, memory cell array 201 is a PCM cell array, and storage unit 212 is a PCM element (e.g., including chalcogenide alloys) for storing binary information of the respective PCM cell based on the different resistivities of the PCM element in the amorphous phase and the crystalline phase. In some implementations, memory cell array 201 is a FRAM cell array, and storage unit 212 is a ferroelectric capacitor for storing binary information of the respective FRAM cell based on the switch between two polarization states of ferroelectric materials under an external electric field.

As shown in FIG. 2, memory cells 208 can be arranged in a two-dimensional (2D) array having rows and columns. Memory device 200 can include word lines 204 coupling peripheral circuits 202 and memory cell array 201 for controlling the switch of vertical transistors 210 in memory cells 208 located in a row, as well as bit lines 206 coupling peripheral circuits 202 and memory cell array 201 for sending data to and/or receiving data from memory cells 208 located in a column. That is, each word line 204 is coupled to a respective row of memory cells 208, and each bit line is coupled to a respective column of memory cells 208.

Consistent with the scope of the present disclosure, vertical transistors 210, such as vertical metal-oxide-semiconductor field-effect transistors (MOSFETs), can replace the conventional planar transistors as the pass transistors of memory cells 208 to reduce the area occupied by the pass transistors, the coupling capacitance, as well as the interconnect routing complexity, as described below in detail. As shown in FIG. 2, in some implementations, different from planar transistors in which the active regions are formed in the substrates, vertical transistor 210 includes a semiconductor body 214 extending vertically (in the z-direction) above the substrate (not shown). That is, semiconductor body 214 can extend above the top surface of the substrate to expose not only the top surface of semiconductor body 214, but also one or more side surfaces thereof. As shown in FIG. 2, for example, semiconductor body 214 can have a cuboid shape to expose four sides thereof. It is understood that semiconductor body 214 may have any suitable 3D shape, such as polyhedron shapes or a cylinder shape. That is, the cross-section of semiconductor body 214 in the plan view (e.g., in the x-y plane) can have a square shape, a rectangular shape (or a trapezoidal shape), a circular (or an oval shape), or any other suitable shapes. It is understood that consistent with the scope of the present disclosure, for semiconductor bodies that have a circular or oval shape of their cross-sections in the plan view, the semiconductor bodies may still be considered to having multiple sides, such that the gate structures are in contact with more than one side of the semiconductor bodies. As described below with respect to the fabrication process, semiconductor body 214 can be formed from the substrate (e.g., by etching or epitaxy) and thus, has the same semiconductor material (e.g., crystalline silicon) as the substrate (e.g., a silicon substrate).

In some implementations, vertical transistor 210 can also include a gate structure 216 in contact with one or more sides of semiconductor body 214, i.e., in one or more planes of the side surface(s) of the active region. In other words, the active region of vertical transistor 210, i.e., semiconductor body 214, can be at least partially surrounded by gate structure 216. It is noted that, FIG. 2 shows that gate structure 216 can be an all-around-gate structure laterally surrounding all sides of semiconductor body 214. In some other implementations not shown in FIG. 2, gate structure 216 can include one or more flat sides or curved sides partially surrounding semiconductor body 214.

Gate structure 216 can include a gate dielectric 218 over one or more sides of semiconductor body 214, e.g., in contact with four side surfaces of semiconductor body 214, as shown in FIG. 2. Gate structure 216 can also include a gate electrode 220 over and in contact with gate dielectric 218. Gate dielectric 218 can include any suitable dielectric materials, such as silicon oxide, silicon nitride, silicon oxynitride, or high-k dielectrics. For example, gate dielectric 218 may include silicon oxide, i.e., gate oxide. Gate electrode 220 can include any suitable conductive materials, such as polysilicon, metals (e.g., tungsten (W), copper (Cu), aluminum (Al), etc.), metal compounds (e.g., titanium nitride (TiN), tantalum nitride (TaN), etc.), or silicides. For example, gate electrode 220 may include doped polysilicon, i.e., a gate poly. In some implementations, gate electrode 220 includes multiple conductive layers, such as a W layer over a TiN layer. It is understood that gate electrode 220 and word line 204 may be a continuous conductive structure in some examples. In other words, gate electrode 220 may be viewed as part of word line 204 that forms gate structure 216, or word line 204 may be viewed as the extension of gate electrode 220 to be coupled to peripheral circuits 202.

As shown in FIG. 2, vertical transistor 210 can further include a pair of a source and a drain (S/D, doped regions, a.k.a., source electrode and drain electrode) formed at the two ends of semiconductor body 214 in the vertical direction (the z-direction), respectively. The source and drain can be doped with any suitable P-type dopants, such as boron (B) or Gallium (Ga), or any suitable N-type dopants, such as phosphorus (P) or arsenic (As). The source and drain can be separated by gate structure 216 in the vertical direction (the z-direction). In other words, gate structure 216 is formed vertically between the source and drain. As a result, one or more channels (not shown) of vertical transistor 210 can be formed in semiconductor body 214 vertically between the source and drain when a gate voltage applied to gate electrode 220 of gate structure 216 is above the threshold voltage of vertical transistor 210. That is, each channel of vertical transistors 210 is also formed in the vertical direction along which semiconductor body 214 extends, according to some implementations.

In some implementations, as shown in FIG. 2, vertical transistor 210 is a multi-gate transistor. That is, gate structure 216 can be in contact with more than one side of semiconductor body 214 (e.g., four sides in FIG. 2) to form more than one gate, such that more than one channel can be formed between the source and drain in operation. That is, different from the planar transistor that includes only a single planar gate (and resulting in a single planar channel), vertical transistor 210 shown in FIG. 2 can include multiple vertical gates on multiple sides of semiconductor body 214 due to the 3D structure of semiconductor body 214 and gate structure 216 that surrounds the multiple sides of semiconductor body 214. As a result, compared with planar transistors, vertical transistor 210 shown in FIG. 2 can have a larger gate control area to achieve better channel control with a smaller subthreshold swing. During the off state, since the channel is fully depleted, the leakage current (100 of vertical transistor 210 can be significantly reduced as well. As described below in detail, the multi-gate vertical transistors can include double-gate vertical transistors (e.g., dual-side gate vertical transistors), tri-gate vertical transistors (e.g., tri-side gate vertical transistors), and GAA vertical transistors.

It is understood that although vertical transistor 210 is shown as a multi-gate transistor in FIG. 2, the vertical transistors disclosed herein may also include single-gate transistors as described below in detail. That is, gate structure 216 may be in contact with a single side of semiconductor body 214, for example, for the purpose of increasing the transistor and memory cell density. It is also understood that although gate dielectric 218 is shown as being separate (i.e., a separate structure) from other gate dielectrics of adjacent vertical transistors (not shown), gate dielectric 218 may be part of a continuous dielectric layer having multiple gate dielectrics of vertical transistors.

In planar transistors and some lateral multiple-gate transistors (e.g., FinFET), the active regions, such as semiconductor bodies (e.g., Fins), extend laterally (in the x-y plane), and the source and the drain are disposed at different locations in the same lateral plane (the x-y plane). In contrast, in vertical transistor 210, semiconductor body 214 extends vertically (in the z-direction), and the source and the drain are disposed in the different lateral planes, according to some implementations. In some implementations, the source and the drain are formed at two ends of semiconductor body 214 in the vertical direction (the z-direction), respectively, thereby overlapping in the plan view. As a result, the area (in the x-y plane) occupied by vertical transistor 210 can be reduced compared with planar transistor and lateral multiple-gate transistors. Also, the metal wiring coupled to vertical transistors 210 can be simplified as well since the interconnects can be routed in different planes. For example, bit lines 206 and storage units 212 may be formed on opposite sides of vertical transistor 210. In one example, bit line 206 may be coupled to the source or the drain at the upper end of semiconductor body 214, while storage unit 212 may be coupled to the other source or the drain at the lower end of semiconductor body 214.

Figure 3:
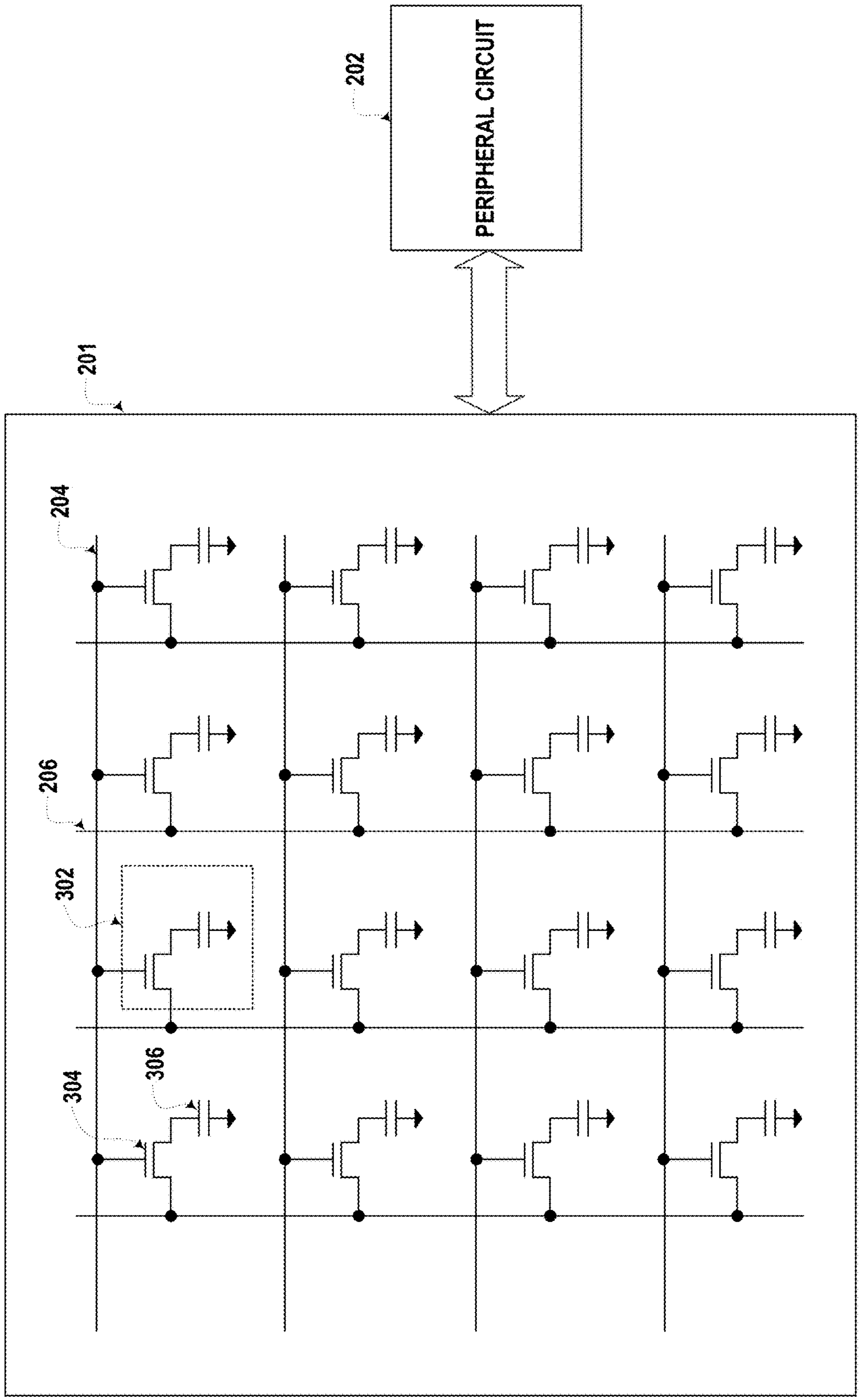
FIG. 3 illustrates a schematic circuit diagram of a memory device including peripheral circuits and an array of dynamic random-access memory (DRAM) cells, according to some aspects of the present disclosure.
Figure 4:
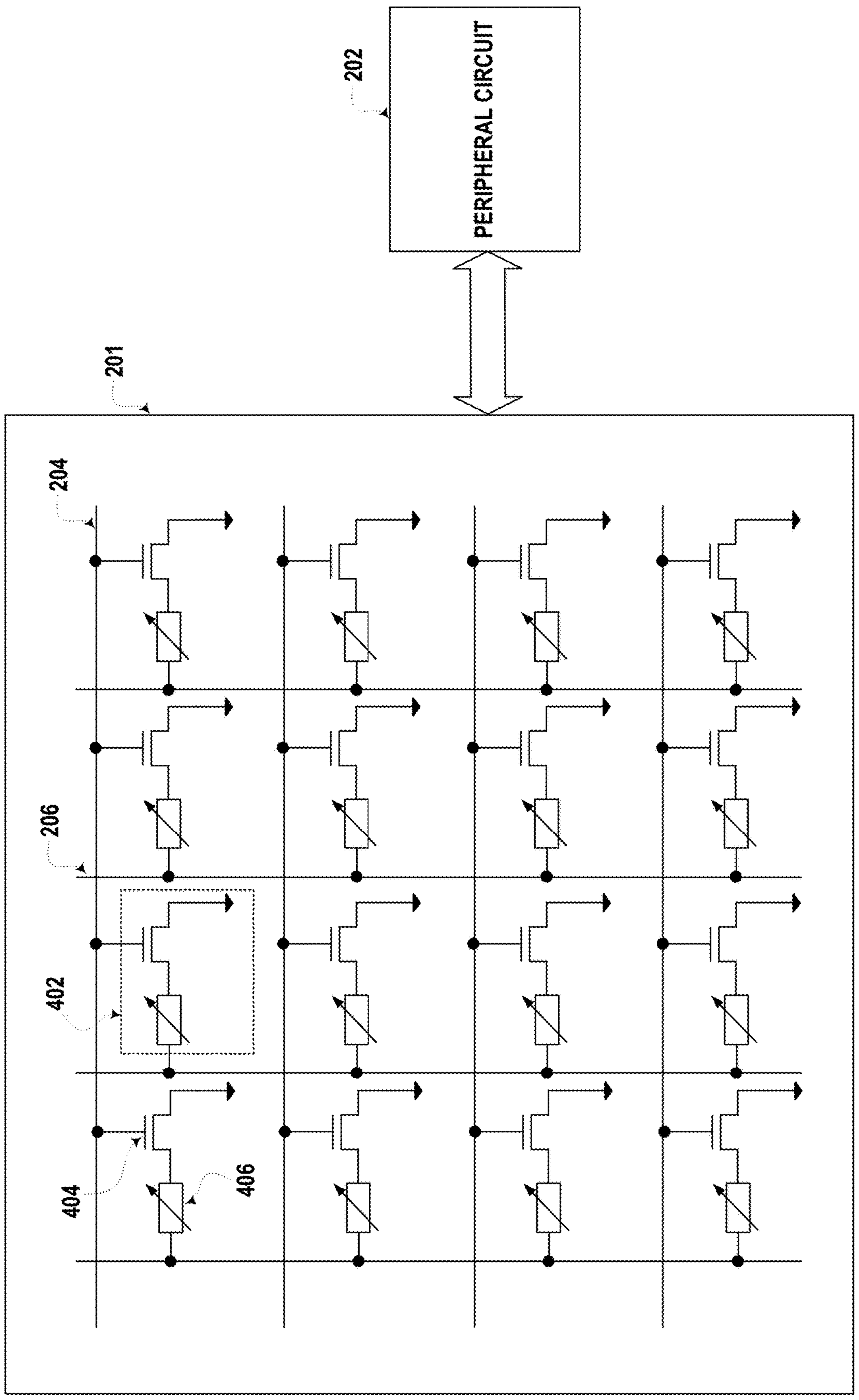
FIG. 4 illustrates a schematic circuit diagram of a memory device including peripheral circuits and an array of phase-change memory (PCM) cells, according to some aspects of the present disclosure.

As shown in FIG. 2, storage unit 212 can be coupled to the source or the drain of vertical transistor 210. Storage unit 212 can include any devices that are capable of storing binary data (e.g., 0 and 1), including but not limited to, capacitors for DRAM cells and FRAM cells, and PCM elements for PCM cells. In some implementations, vertical transistor 210 controls the selection and/or the state switch of the respective storage unit 212 coupled to vertical transistor 210. In some implementations as shown in FIG. 3, each memory cell 208 is a DRAM cell 302 including a transistor 304 (e.g., implementing using vertical transistors 210 in FIG. 2) and a capacitor 306 (e.g., an example of storage unit 212 in FIG. 2). The gate of transistor 304 (e.g., corresponding to gate electrode 220) may be coupled to word line 204, one of the source and the drain of transistor 304 may be coupled to bit line 206, the other one of the source and the drain of transistor 304 may be coupled to one electrode of capacitor 306, and the other electrode of capacitor 306 may be coupled to the ground. In some implementations as shown in FIG. 4, each memory cell 208 is a PCM cell 402 including a transistor 404 (e.g., implementing using vertical transistors 210 in FIG. 2) and a PCM element 406 (e.g., an example of storage unit 212 in FIG. 2). The gate of transistor 404 (e.g., corresponding to gate electrode 220) may be coupled to word line 204, one of the source and the drain of transistor 404 may be coupled to the ground, the other one of the source and the drain of transistor 404 may be coupled to one electrode of PCM element 406, and the other electrode of PCM element 406 may be coupled to bit line 206.

Peripheral circuits 202 can be coupled to memory cell array 201 through bit lines 206, word lines 204, and any other suitable metal wirings. As described above, peripheral circuits 202 can include any suitable circuits for facilitating the operations of memory cell array 201 by applying and sensing voltage signals and/or current signals through word lines 204 and bit lines 206 to and from each memory cell 208. Peripheral circuits 202 can include various types of peripheral circuits formed using CMOS technologies.

Figure 5:
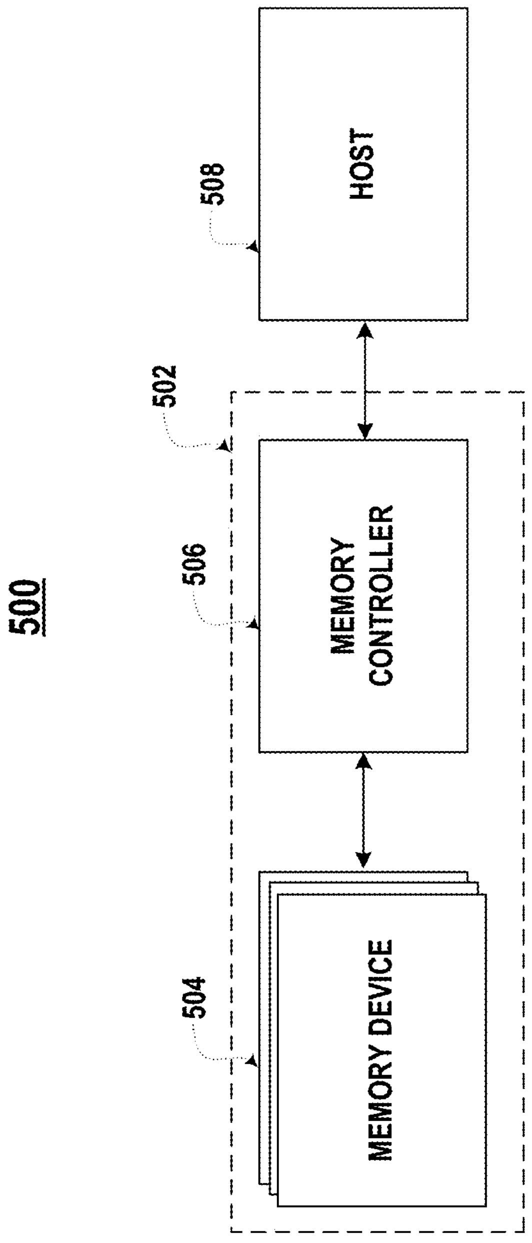
FIG. 5 illustrates a block diagram of an exemplary system having a memory device, according to some aspects of the present disclosure.

FIG. 5 illustrates a block diagram of a system 500 having a memory device, according to some aspects of the present disclosure. System 500 can be a mobile phone, a desktop computer, a laptop computer, a tablet, a vehicle computer, a gaming console, a printer, a positioning device, a wearable electronic device, a smart sensor, a virtual reality (VR) device, an argument reality (AR) device, or any other suitable electronic devices having storage therein. As shown in FIG. 27, system 500 can include a host 508 and a memory system 502 having one or more memory devices 504 and a memory controller 506. Host 508 can be a processor of an electronic device, such as a central processing unit (CPU), or a system-on-chip (SoC), such as an application processor (AP). Host 508 can be configured to send or receive the data to or from memory devices 504.

Memory device 504 can be any memory devices disclosed herein, such as 3D memory device 100. In some implementations, memory device 504 includes an array of memory cells each including a vertical transistor, as described above in detail.

Memory controller 506 is coupled to memory device 504 and host 508 and is configured to control memory device 504, according to some implementations. Memory controller 506 can manage the data stored in memory device 504 and communicate with host 508. Memory controller 506 can be configured to control operations of memory device 504, such as read, write, and refresh operations. Memory controller 506 can also be configured to manage various functions with respect to the data stored or to be stored in memory device 504 including, but not limited to refresh and timing control, command/request translation, buffer and schedule, and power management. In some implementations, memory controller 506 is further configured to determine the maximum memory capacity that the computer system can use, the number of memory banks, memory type and speed, memory particle data depth and data width, and other important parameters. Any other suitable functions may be performed by memory controller 506 as well. Memory controller 506 can communicate with an external device (e.g., host 508) according to a particular communication protocol. For example, memory controller 506 may communicate with the external device through at least one of various interface protocols, such as a USB protocol, an MMC protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a Firewire protocol, etc.

Figure 6A:
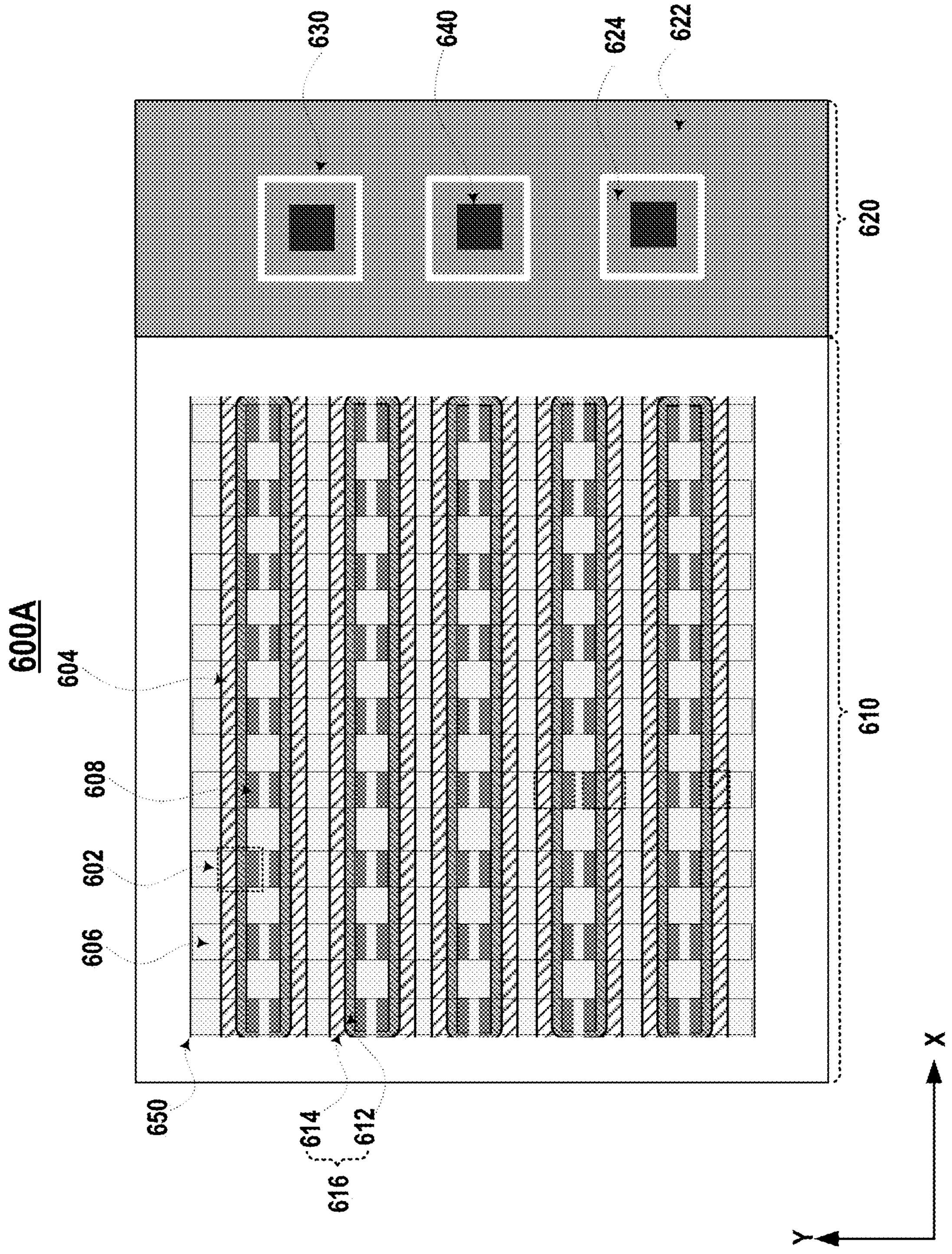
FIG. 6A illustrates a plan view of a memory device, according to some aspects of the present disclosure.
Figure 6B:
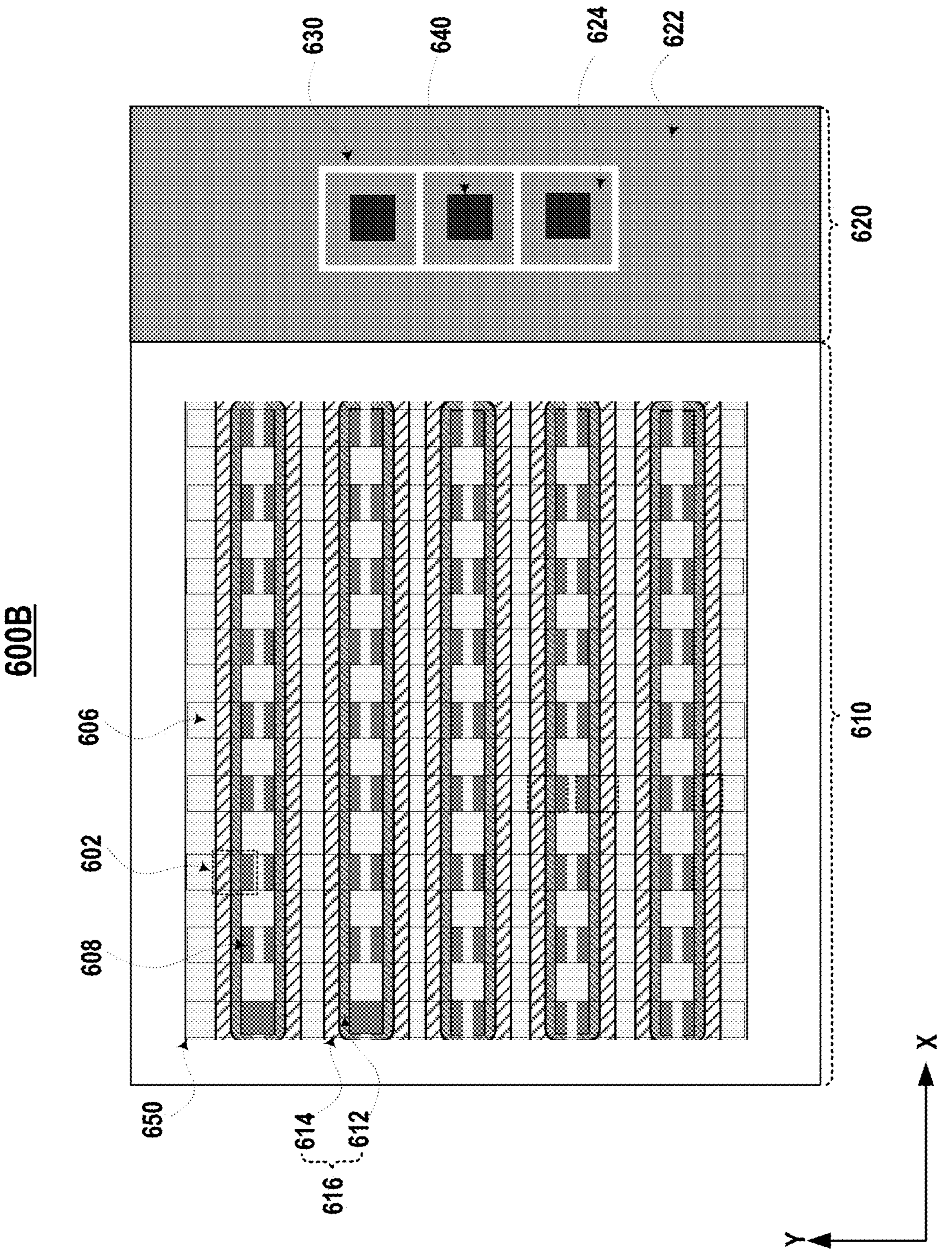
FIG. 6B illustrates a plan view of a memory device, according to some aspects of the present disclosure.

FIGS. 6A and 6B each illustrates a plan view of a memory device, according to some aspects of the present disclosure. In some implementations, the memory device 600A shown in FIG. 6A and/or the memory device 600B shown in FIG. 6B can include a memory array region 610 and at least one contact region 620 (also referred to as periphery region) at a side of the memory array region 610. It is noted that some other implementations not shown in FIGS. 6A and 6B, two or more contact regions 620 can be located at multiple sides (e.g., 2, 3, or 4 sides) of the memory array region 610. A memory cell array 650 can be located in the memory array region 610.

In some implementations, the vertical transistors of memory cells in a memory device (e.g., memory device 200) are single-gate transistors, and the gate dielectrics of vertical transistors in the word line direction are continuous. As shown in FIGS. 6A and 6B, memory cell array 650 can include a plurality of word lines 604 each extending in a first lateral direction (the x-direction, referred to as the word line direction). Memory cell array 650 can also include a plurality of bit lines 606 each extending in a second lateral direction perpendicular to the first lateral direction (the y-direction, referred to as the bit line direction). It is understood that FIGS. 6A and 6B do not illustrate a cross-section of memory device 600A or 600B in the same lateral plane, and word lines 604 and bit lines 606 may be formed in different lateral planes for ease of routing as described below in detail.

Memory cells 602 can be formed at the intersections of word lines 604 and bit lines 606. In some implementations, each memory cell 602 includes a vertical transistor (e.g., vertical transistor 210 in FIG. 2) having a semiconductor body 608 and a gate structure 616. Semiconductor body 608 can extend in a substrate in the vertical direction (the z-direction, not shown) perpendicular to the first and second lateral directions. The vertical transistor can be a single-gate transistor in which gate structure 616 is in contact with a single side (e.g., one of four sides in FIGS. 6A and 6B) of semiconductor body 608 (the active region in which channels are formed). As shown in FIGS. 6A and 6B, the vertical transistor is a single-gate transistor in which gate structure 616 abuts one side of semiconductor body 608 (having a rectangle or square-shaped cross-section) in the bit line direction (the y-direction) in the plan view. Gate structure 616 does not surround and contact the other three sides of semiconductor body 608, according to some implementations. Gate structure 616 can include a gate dielectric 612 abutting one side of semiconductor body 608 in the plan view, and a gate electrode 614 in contact with gate dielectric 612. In some implementations, gate dielectric 612 is laterally between gate electrode 614 and semiconductor body 608 in the bit line direction (the y-direction). As described above, gate electrode 614 may be part of word line 604, and word line 604 may be an extension of gate electrode 614. That is, gate electrodes 614 of adjacent vertical transistors in the word line direction (the x-direction) are continuous, e.g., parts of a continuous conductive layer having gate electrodes 614 and word lines 604.

As shown in FIGS. 6A and 6B, the contact region 620 can be located on one side of the memory array region 610 along the word line direction (the x-direction). It is noted that in some other implementations not shown in the figures, the contact region 620 can be located on one side of the memory array region 610 along the bit line direction (the y-direction). As shown in FIGS. 6A and 6B, a plurality of isolation structures 630 can be located in contact region 620. Each isolation structure 630 can vertically extending through a semiconductor layer 622 and laterally encircling an inner portion semiconductor layer 624. A contact 640 can vertically extend through the inner portion semiconductor layer 624. In some implementations, a lateral cross section of the first isolation structure in the lateral plane (e.g., x-y plane) can be a ring-like shape. That is, the isolation structure 630 can isolate the inner portion semiconductor layer 624 from other portion outside the isolation structure 630. In some implementations, as shown in FIG. 6A, adjacent isolation structures can be separated from each other. In some implementations, as shown in FIG. 6B, adjacent isolation structures can share a common isolation wall. It is noted that, the width, size, and number of the isolation structures 630 can be adjusted to reduce the CIO between the semiconductor layer 622 and formed contact pads (not shown in FIGS. 6A and 6B).

Figure 7:
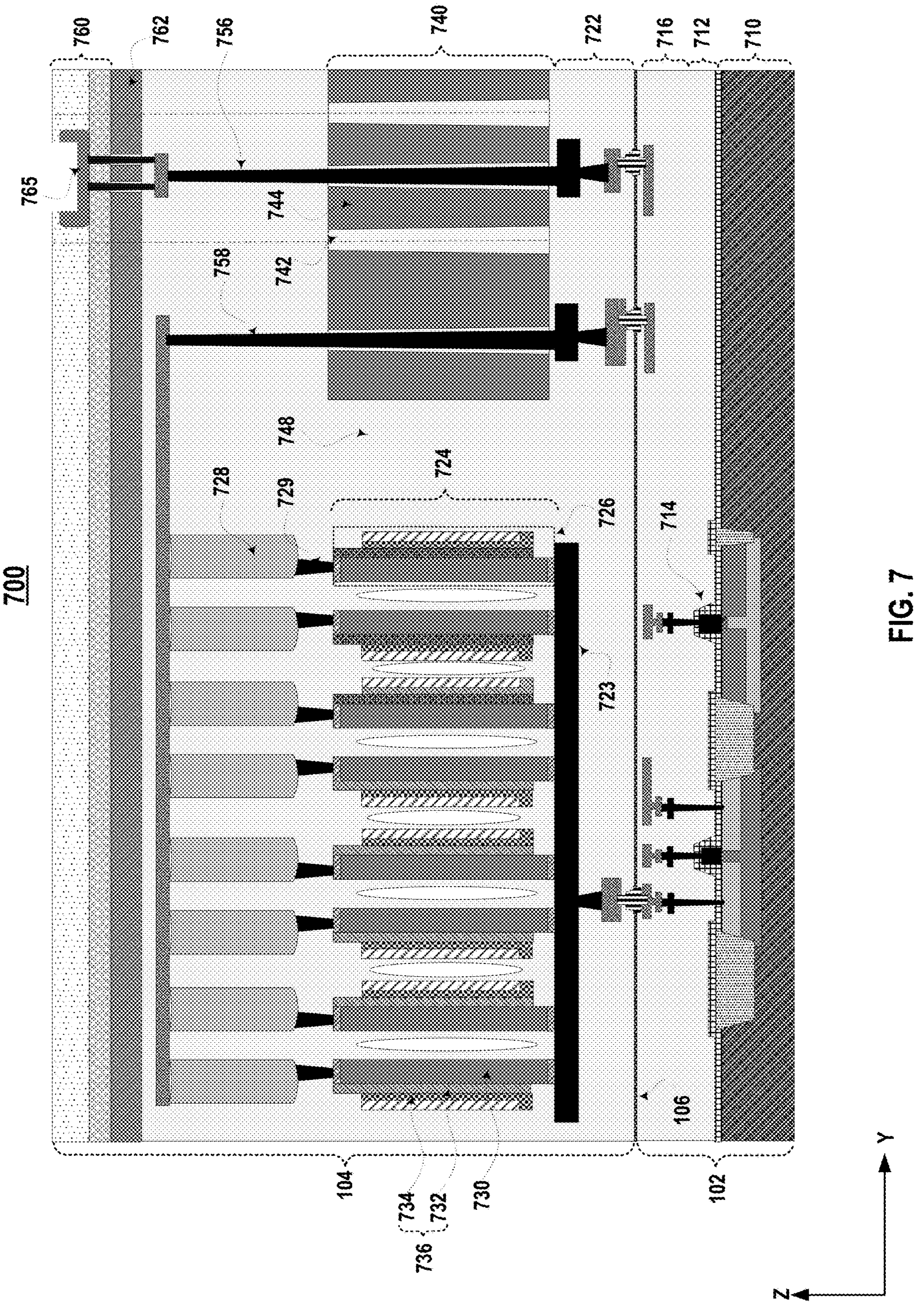
FIG. 7 illustrates a side view of a cross-section of a 3D memory device, according to some aspects of the present disclosure.

FIG. 7 illustrates a side view of a cross-section of a 3D memory device 700 including vertical transistors, according to some aspects of the present disclosure. It is understood that FIG. 7 is for illustrative purposes only and may not necessarily reflect the actual device structure (e.g., interconnections) in practice. As one example of 3D memory device 100 described above with respect to FIG. 1, 3D memory device 700 is a bonded chip including first semiconductor structure 102 and second semiconductor structure 104 stacked over first semiconductor structure 102. First and second semiconductor structures 102 and 104 are jointed at bonding interface 106 therebetween, according to some implementations. As shown in FIG. 7, first semiconductor structure 102 can include a substrate 710, which can include silicon (e.g., single crystalline silicon, c-Si), SiGe, GaAs, Ge, SOI, or any other suitable materials.

First semiconductor structure 102 can include peripheral circuits 712 on substrate 710. In some implementations, peripheral circuits 712 include a plurality of transistors 714 (e.g., planar transistors and/or 3D transistors). Trench isolations (e.g., shallow trench isolations (STIs)) and doped regions (e.g., wells, sources, and drains of transistors 714) can be formed on or in substrate 710 as well.

In some implementations, first semiconductor structure 102 further includes an interconnect layer 716 above peripheral circuits 712 to transfer electrical signals to and from peripheral circuits 712. Interconnect layer 716 can include a plurality of interconnects (also referred to herein as "contacts"), including lateral interconnect lines and VIA contacts. Interconnect layer 716 can further include one or more ILD layers in which the interconnect lines, via contacts, and bonding contacts can form. That is, interconnect layer 716 can include interconnect lines, via contacts, and bonding contacts in multiple ILD layers. In some implementations, peripheral circuits 712 are coupled to one another through the interconnects in interconnect layer 716. The interconnects in interconnect layer 716 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof.

Second semiconductor structure 104 can be bonded on top of first semiconductor structure 102 in a face-to-face manner at bonding interface 106. In some implementations, bonding interface 106 is a result of hybrid bonding (also known as "metal/dielectric hybrid bonding"), which is a direct bonding technology (e.g., forming bonding between surfaces without using intermediate layers, such as solder or adhesives) and can obtain metal-metal bonding and dielectric-dielectric bonding simultaneously.

In some implementations, second semiconductor structure 104 further includes an interconnect layer 722 including bit lines 723, interconnect lines, via contacts, and bonding contacts to transfer electrical signals. Interconnect layer 722 can include a plurality of interconnects, such as MEOL interconnects and BEOL interconnects. In some implementations, the interconnects in interconnect layer 722 also include local interconnects, such as bit lines 723 (e.g., an example of bit lines 606 in FIGS. 6A and 6B) and word line contacts (not shown). Interconnect layer 722 can further include one or more ILD layers in which the interconnect lines and via contacts can form. The interconnects in interconnect layer 722 can include conductive materials including, but not limited to, W, Co, Cu, Al, doped silicon, silicides, or any combination thereof. The ILD layers can be formed with dielectric materials including, but not limited to, silicon oxide, silicon nitride, silicon oxynitride, low-k dielectrics, or any combination thereof. In some implementations, peripheral circuits 712 include a word line driver/row decoder coupled to the word line contacts in interconnect layer 722 through interconnect lines, via contacts, and bonding contacts interconnect layer 716 and 722. In some implementations, peripheral circuits 712 include a bit line driver/column decoder coupled to bit lines 723 and bit line contacts (if any) in interconnect layer 722 through interconnect lines, via contacts, and bonding contacts interconnect layer 716 and 722.

In some implementations, second semiconductor structure 104 includes a DRAM device in which memory cells are provided in the form of an array of DRAM cells 724 (e.g., an example of memory cells 602 in FIGS. 6A and 6B) above interconnect layer 722. It is understood that the cross-section of 3D memory device 700 in FIG. 7 may be made along the bit line direction (they-direction), and one bit line 723 in interconnect layer 722 extending laterally in they-direction may be coupled to a column of DRAM cells 724. Each DRAM cell 724 can include a vertical transistor 726 (e.g., an example of vertical transistors 210 in FIG. 2) and capacitor 728 (e.g., an example of storage unit 212 in FIG. 2) coupled to the vertical transistor 726. DRAM cell 724 can be a 1T1C cell consisting of one transistor and one capacitor. It is understood that DRAM cell 724 may be of any suitable configurations, such as 2T1C cell, 3T1C cell, etc.

Vertical transistor 726 can be a MOSFET used to switch a respective DRAM cell 724. In some implementations, vertical transistor 726 includes a semiconductor body 730 (i.e., the active region in which a channel can form) extending vertically (in the z-direction), and a gate structure 736 in contact with one side of semiconductor body 730 in the bit line direction (the y-direction). As described above, as in a single-gate vertical transistor, semiconductor body 730 can have a cuboid shape or a cylinder shape, and gate structure 736 can abut a single side of semiconductor body 730 in the plan view. Gate structure 736 includes a gate electrode 734 and a gate dielectric 732 laterally between gate electrode 734 and semiconductor body 730 in the bit line direction, according to some implementations. In some implementations, gate dielectric 732 abuts one side of semiconductor body 730, and gate electrode 734 abuts gate dielectric 732.

As shown in FIG. 7, in some implementations, semiconductor body 730 has two ends (the upper end and lower end) in the vertical direction (the z-direction) extending beyond gate electrode 734, respectively, in the vertical direction (the z-direction) into ILD layers. That is, semiconductor body 730 can have a larger vertical dimension (e.g., the depth) than that of gate electrode 734 (e.g., in the z-direction). Thus, short circuits between bit lines 723 and word lines/gate electrodes 734 or between word lines/gate electrodes 734 and capacitors 728 can be avoided. Vertical transistor 726 can further include a source and a drain disposed at the two ends of semiconductor body 730, respectively, in the vertical direction (the z-direction). In some implementations, one of source and drain (e.g., at the upper end in FIG. 7) is coupled to capacitor 728, and the other one of source and drain (e.g., at the lower end in FIG. 7) is coupled to bit line 723.

In some implementations, semiconductor body 730 includes semiconductor materials, such as single crystalline silicon, polysilicon, amorphous silicon, Ge, any other semiconductor materials, or any combinations thereof. In one example, semiconductor body 730 may include single crystalline silicon. The two ends of semiconductor body 730 can be doped with N-type dopants (e.g., P or As) or P-type dopants (e.g., B or Ga) at a desired doping level and be used as the source/drain. In some implementations, a silicide layer, such as a metal silicide layer, is formed between the source/drain and bit line 723 or first electrode 729 to reduce the contact resistance. In some implementations, gate dielectric 732 includes dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. In some implementations, gate electrode 734 includes conductive materials including, but not limited to W, Co, Cu, Al, TiN, TaN, polysilicon, silicides, or any combination thereof. In some implementations as shown in FIG. 7, gate electrode 734 can include multiple conductive layers, such as a W layer over a TiN layer. In one example, gate structure 736 may be a "gate oxide/gate poly" gate in which gate dielectric 732 includes silicon oxide and gate electrode 734 includes doped polysilicon. In another example, gate structure 736 may be an HKMG in which gate dielectric 732 includes a high-k dielectric and gate electrode 734 includes a metal.

As described above, since gate electrode 734 may be part of a word line or extend in the word line direction (e.g., the x-direction in FIGS. 6A and 6B) as a word line, second semiconductor structure 104 of 3D memory device 700 can also include a plurality of word lines (e.g., an example of word lines 604 in FIGS. 6A and 6B, referred to as 734 as well) each extending in the word line direction (the x-direction). Each word line 734 can be coupled to a row of DRAM cells 724. That is, bit line 723 and word line 734 can extend in two perpendicular lateral directions, and semiconductor body 730 of vertical transistor 726 can extend in the vertical direction perpendicular to the two lateral directions in which bit line 723 and word line 734 extend. Word lines 734 are in contact with word line contacts (not shown), according to some implementations. In some implementations, word lines 734 include conductive materials including, but not limited to W, Co, Cu, Al, TiN, TaN, polysilicon, silicides, or any combination thereof. In some implementations, word line 734 includes multiple conductive layers, such as a W layer over a TiN layer, as shown in FIG. 7.

It is understood that the structure and configuration of capacitor 728 may include any suitable structure and configuration, such as a planar capacitor, a stack capacitor, a multi-fins capacitor, a cylinder capacitor, a trench capacitor, or a substrate-plate capacitor. In some implementations, the capacitor dielectric can include dielectric materials, such as silicon oxide, silicon nitride, or high-k dielectrics including, but not limited to, $Al_2O_3$, $HfO_2$, $Ta_2O_5$, $ZrO_2$, $TiO_2$, or any combination thereof. It is understood that in some examples, capacitor 728 may be a ferroelectric capacitor used in a FRAM cell, and the capacitor dielectric may be replaced by a ferroelectric layer having ferroelectric materials, such as PZT or SBT. In some implementations, the capacitor electrodes include conductive materials including, but not limited to W, Co, Cu, Al, TiN, TaN, polysilicon, silicides, or any combination thereof.

As shown in FIG. 7, vertical transistor 726 extends vertically through and contacts word lines 734, the source/drain of vertical transistor 726 at the lower end thereof is in contact with bit line 723, and the source/drain of vertical transistor 726 at the upper end thereof is in contact with the capacitor electrode of capacitor 728, according to some implementations. That is, bit line 723 and capacitor 728 can be disposed in different planes in the vertical direction and coupled to opposite ends of vertical transistor 726 of DRAM cell 724 in the vertical direction due to the vertical arrangement of vertical transistor 726. In some implementations, bit line 723 and capacitor 728 are disposed on opposite sides of vertical transistor 726 in the vertical direction, which simplifies the routing of bit lines 723 and reduces the coupling capacitance between bit lines 723 and capacitors 728 compared with conventional DRAM cells in which the bit lines and capacitors are disposed on the same side of the planar transistors.

In some implementations, second semiconductor structure 104 further includes a semiconductor layer 740 located at a side of the array of DRAM cells 724. In some implementations, the semiconductor layer 740 and the semiconductor bodies 730 of DRAM cells 724 can be formed from the same semiconductor substrate, and thus include the same semiconductor material. As shown in FIG. 7, the semiconductor layer 740 and the semiconductor bodies 730 of DRAM cells 724 can be separated by dielectric structure 748. In some implementations, one or more isolation structures 742 can be formed to vertically extend through the semiconductor layer 740. Isolation structures 742 can include any suitable dielectric material to isolate the inner portion semiconductor layer 744 that is encircled by the isolation structures 742 from other portions of the semiconductor layer 740 outside the isolation structures 742. At least one inner contact 756, also referred to as an inner through silicon contact (TSC), can vertically extend through the inner portion semiconductor layer 744 to electrically connect the interconnects in interconnect layer 722 and contact pads 765. At least one outer contact 758, also referred to as an outer through silicon contact (TSC), can vertically extend through the outer portion semiconductor layer 740 to electrically connect the interconnects in interconnect layer 722 and a conductive layer in electric connection with capacitors 728. Inner contacts 756 and outer contacts 758 can include conductive materials including, but not limited to, W, Co, Cu, Al, silicides, or any combination thereof. In some implementations, inner contacts 756 and outer contacts 758 include a via surrounded by a dielectric spacer (e.g., having silicon oxide) to electrically separate the via from the semiconductor layer 740/744.

In some implementations, second semiconductor structure 104 further includes a substrate 762 disposed above DRAM cells 724 and semiconductor layer 740. As described below with respect to the fabrication process, substrate 762 can be part of a carrier wafer. It is understood that in some examples, substrate 762 may not be included in second semiconductor structure 104.

As shown in FIG. 7, second semiconductor structure 104 can further include a pad-out interconnect layer 760 above substrate 762 and DRAM cells 724. Pad-out interconnect layer 760 can include interconnects, e.g., contact pads 765, in one or more ILD layers. Pad-out interconnect layer 760 and interconnect layer 722 can be formed on opposite sides of DRAM cells 724. Capacitors 728 are disposed vertically between vertical transistors 726 and pad-out interconnect layer 760, according to some implementations. In some implementations, the interconnects in pad-out interconnect layer 760 can transfer electrical signals between 3D memory device 700 and outside circuits, e.g., for pad-out purposes. Contact pads 765 can include conductive materials including, but not limited to, W, Co, Cu, Al, silicides, or any combination thereof.

In some implementations as shown in FIG. 7, each contact pad 765 can be located above a corresponding inner portion semiconductor layer 744 that is encircled by one isolation structure 742, and a first lateral dimension of the contact pad 765 can be smaller than a second lateral dimension of the inner portion semiconductor layer 744 encircled by the isolation structure 742. That is, a projection lateral of the contact pad 765 on the lateral plane (x-y plane) can be within the isolation structure 742. Due to the isolation structures 742, the CIO between the semiconductor layer 740 and the contact pad 765 can be reduced. Although not shown, it is understood that the pad-out of 3D memory devices is not limited to from second semiconductor structure 104 having DRAM cells 724 as shown in FIG. 7 and may be from first semiconductor structure 102 having peripheral circuit 712 in a similar manner as described above with respect to FIG. 7.

Figure 8:
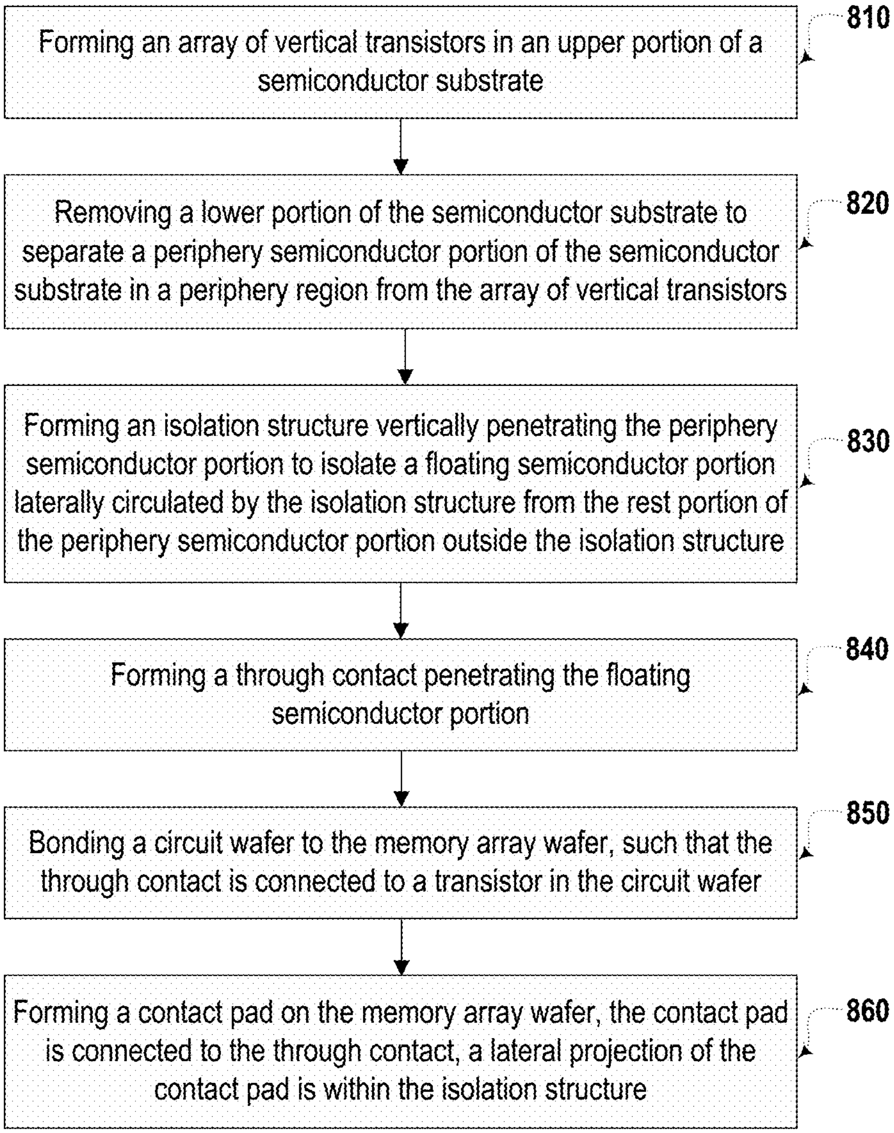
FIG. 8 illustrates a flowchart of a method for forming a 3D memory device, according to some aspects of the present disclosure.

FIG. 8 illustrates a flowchart of an exemplary fabricating method 800 for forming a 3D memory device, according to some implementations of the present disclosure. FIGS. 9,10A-10B, and 11-13 illustrate schematic side cross-sectional views of an exemplary 3D memory device at certain fabricating stages of the method 800 shown in FIG. 8, according to various implementations of the present disclosure. It is understood that the operations shown in method 800 are not exhaustive and that other operations can be performed as well before, after, or between any of the illustrated operations. Further, some of the operations may be performed simultaneously, or in a different order than shown in FIG. 8.

Figure 9:
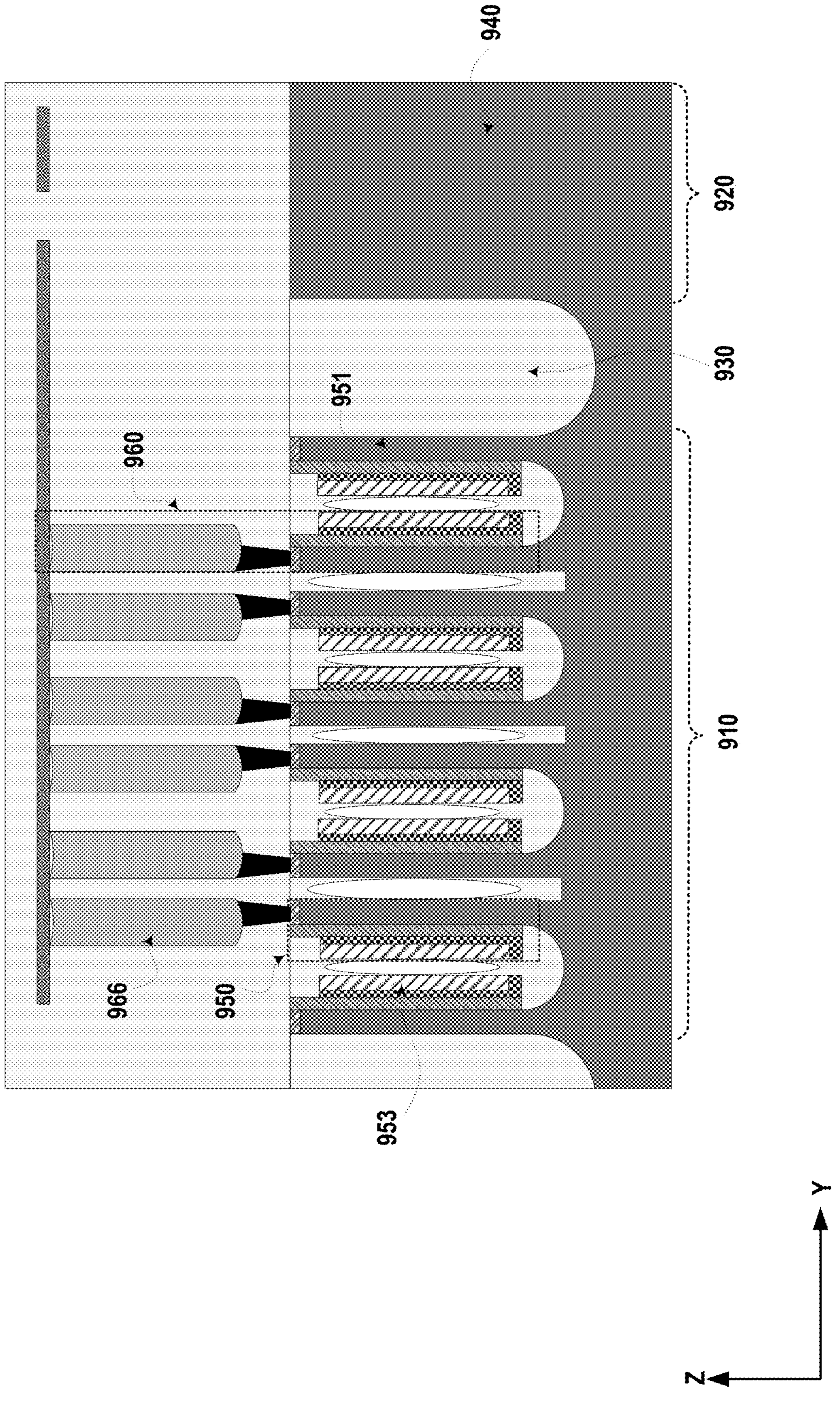
FIGS. 9, 10A-10B, and 11-13 illustrate a fabrication process for forming a 3D memory device, according to some aspects of the present disclosure.

As shown in FIG. 8, method 800 can start at operation 810, in which an array of vertical transistors is in an upper portion of a semiconductor substrate. In some implementations, operation 810 further includes forming an array of memory cells including the array of vertical transistors. FIG. 9 illustrates a schematic side cross-sectional view of the 3D structure in the y-z plane.

In some implementations as shown in FIG. 9, the array of memory cells 960 (e.g., DRAM cells) can include an array of vertical transistors 950 and an array of capacitors 966. The array of vertical transistors 950 can be formed in an upper portion of the semiconductor substrate 940 and in a memory array region 910. Each vertical transistor 950 can include a semiconductor pillar 951 extending vertically (in the z-direction) and have any suitable 3D shape, such as polyhedron shapes or a cylinder shape. That is, the cross-section of each semiconductor pillar 951 in the plan view (e.g., in the x-y plane) can have a square shape, a rectangular shape (or a trapezoidal shape), a circular shape, an oval shape, or any other suitable shapes.

In some implementations, forming the array of semiconductor pillars 951 can include forming a plurality of parallel first spacers extending along the first lateral direction (x-direction), and a plurality of parallel second spacers extending along the second lateral direction (y-direction). In some implementations, a lithography process is performed to pattern a plurality of first, second, and third trenches using an etch mask (e.g., a photoresist mask and/or a hard mask), and one or more dry etching and/or wet etching processes, such as RIE, are performed to etch the plurality of first and second trenches in an upper portion of the semiconductor substrate 940. Then the first spacers and second spacers can be formed by depositing a dielectric material, such as silicon oxide, to fill the first and second trenches, using a thin film deposition process including, but not limited to, CVD, PVD, ALD, or any combination thereof. The remaining upper portions of the semiconductor substrate 940 in the memory array region 910 can form the plurality of semiconductor pillars 951. Further, a third spacer 930 can be formed in the upper portion of the semiconductor substrate 940 between the memory array region 910 and the periphery region 920 (also referred to as contact region). In some implementations, the third spacer 930 and the first trenches are formed in the same process when the third spacer 930 extends along the first lateral direction, and the third spacer 930 and the second trenches are formed in a same process when the third spacer 930 extends along the second lateral direction.

As shown in FIG. 9, forming the array of vertical transistors 950 can further include forming gate structures 953 embedded in the first spacers. In some implementations, each gate structures 953 can include a gate electrode and a gate dielectric layer between the gate electrode and the adjacent semiconductor pillar 951. The gate structures 953 of a row of vertical transistors 950 extending along the first lateral direction can be connected with each other to form a word line. In some implementations, forming the array of vertical transistors 950 can further include doping an end of each semiconductor pillar 951 by ion implantation and/or thermal diffusion to form a source/drain of each vertical transistor 950. As shown in FIG. 9, forming the array of memory cells 960 can further include forming the plurality of capacitors 966 each being electrically coupled with the source/drain of each semiconductor pillar 951.

Figure 10A:
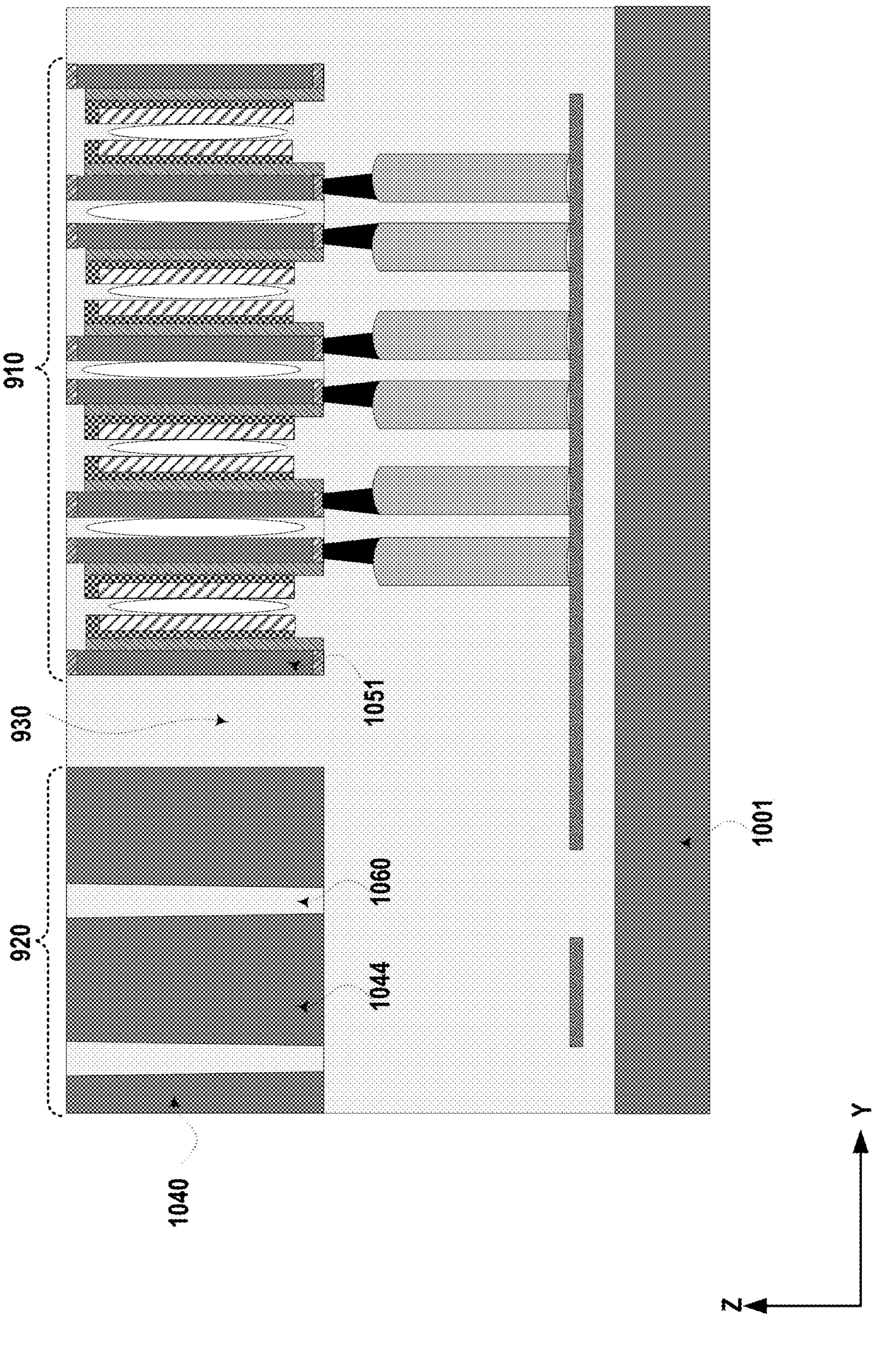
Figure 10B:
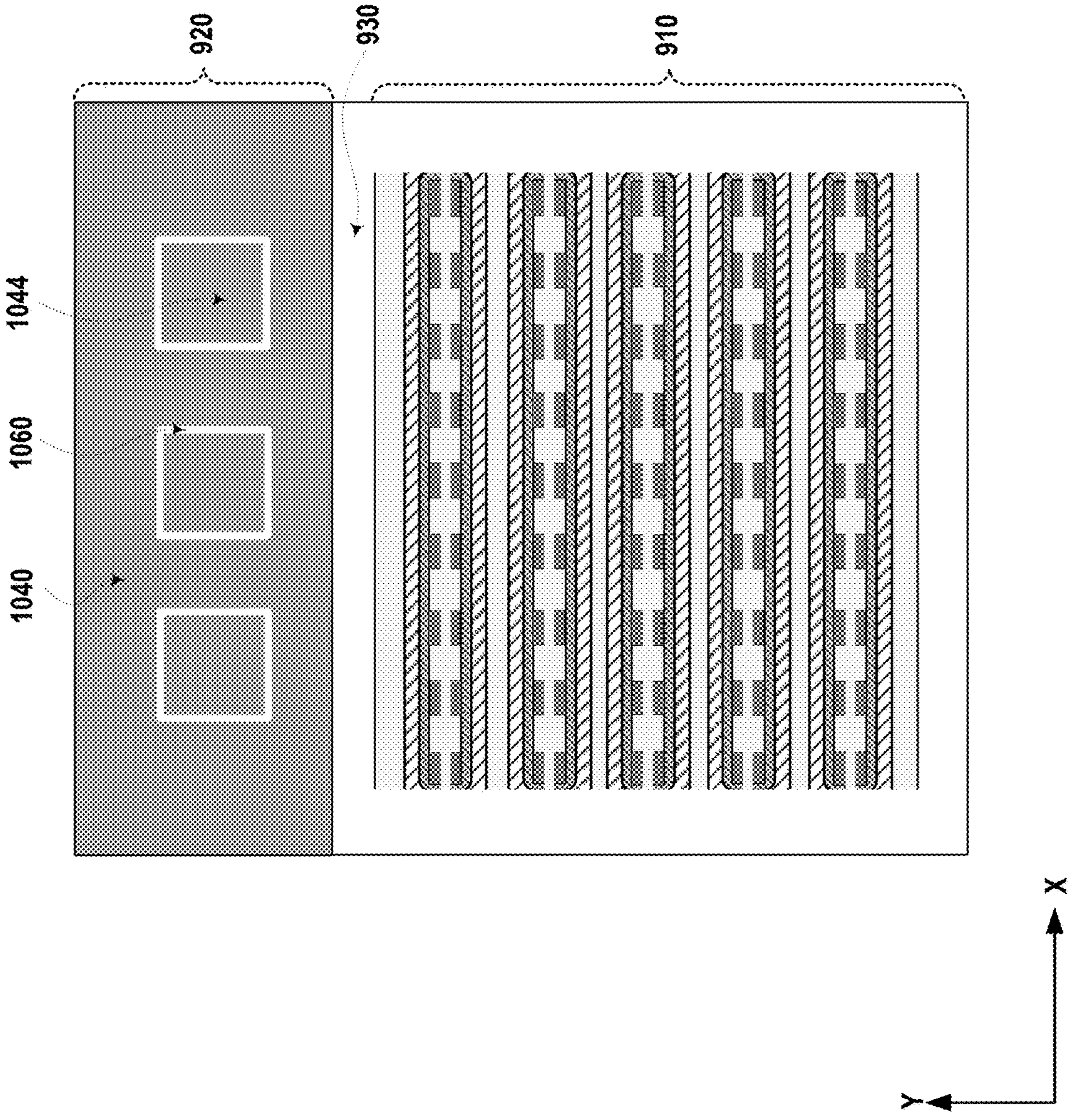

As shown in FIG. 8, method 800 can proceed to operation 820, in which a lower portion of the semiconductor substrate can be removed to separate a periphery semiconductor portion of the semiconductor substrate in a periphery region from the array of vertical transistors. Method 800 can then proceed to operation 830, in which an isolation structure vertically penetrating the periphery semiconductor portion can be formed to isolate a floating semiconductor portion laterally encircled by the isolation structure from the rest portion of the periphery semiconductor portion outside the isolation structure. FIG. 10A illustrates a schematic side cross-sectional view of the 3D structure in the y-z plane after operation 830 of method 800. FIG. 10B illustrates a schematic plane view of the 3D structure along the x-y plane after operation 830 of method 800.

As shown in FIG. 10A, a carrier substrate 1001 can be formed on the 3D structure and then flipped over. Semiconductor substrate 940 can be thinned from the back side (top side in FIG. 10A) by any suitable process, such as a chemical mechanical polishing (CMP) process. As such, the semiconductor pillars 951 in the memory array region 910 can be separated from each other to form a plurality of semiconductor bodies 1051, and the remaining portion of the semiconductor layer substrate 940 in the periphery region 920 can form a periphery semiconductor portion 1040 that is separated from the semiconductor bodies 1051 by the third spacer 930.

As shown in FIGS. 10A and 10B, one or more isolation structures 1060 vertically penetrating the periphery semiconductor portion 1040 can be formed to isolate a floating semiconductor portion 1044 laterally encircled by the isolation structure 1060 from the rest portion of the periphery semiconductor portion 1040 outside the isolation structure 1060. In some implementations, a lithography process is performed to pattern a plurality of slits using an etch mask (e.g., a photoresist mask and/or a hard mask), and one or more dry etching and/or wet etching processes, such as RIE, are performed to etch the slits penetrating the periphery semiconductor portion 1040. Then the isolation structures 1060 can be formed by depositing a dielectric material, such as silicon oxide, to fill the slits, using a thin film deposition process including, but not limited to, CVD, PVD, ALD, or any combination thereof. Each formed isolation structure 1060 can have a ring-like shape in a lateral cross-sectional view. That is, each isolation structure 1060 can encircle a portion of the periphery semiconductor portion 1040 to form a floating semiconductor portion 1044.

Further, as shown in FIG. 10A, the exposed upper end of each semiconductor body 1051, i.e., one of the two ends of semiconductor body 1051 in the vertical direction (the z-direction) that is away from carrier substrate 1001, is doped to form another source/drain. In some implementations, an implantation process and/or thermal diffusion process are performed to dope P-type dopants or N-type dopants to exposed upper ends of semiconductor bodies 1051 to form sources/drains.

Figure 11:
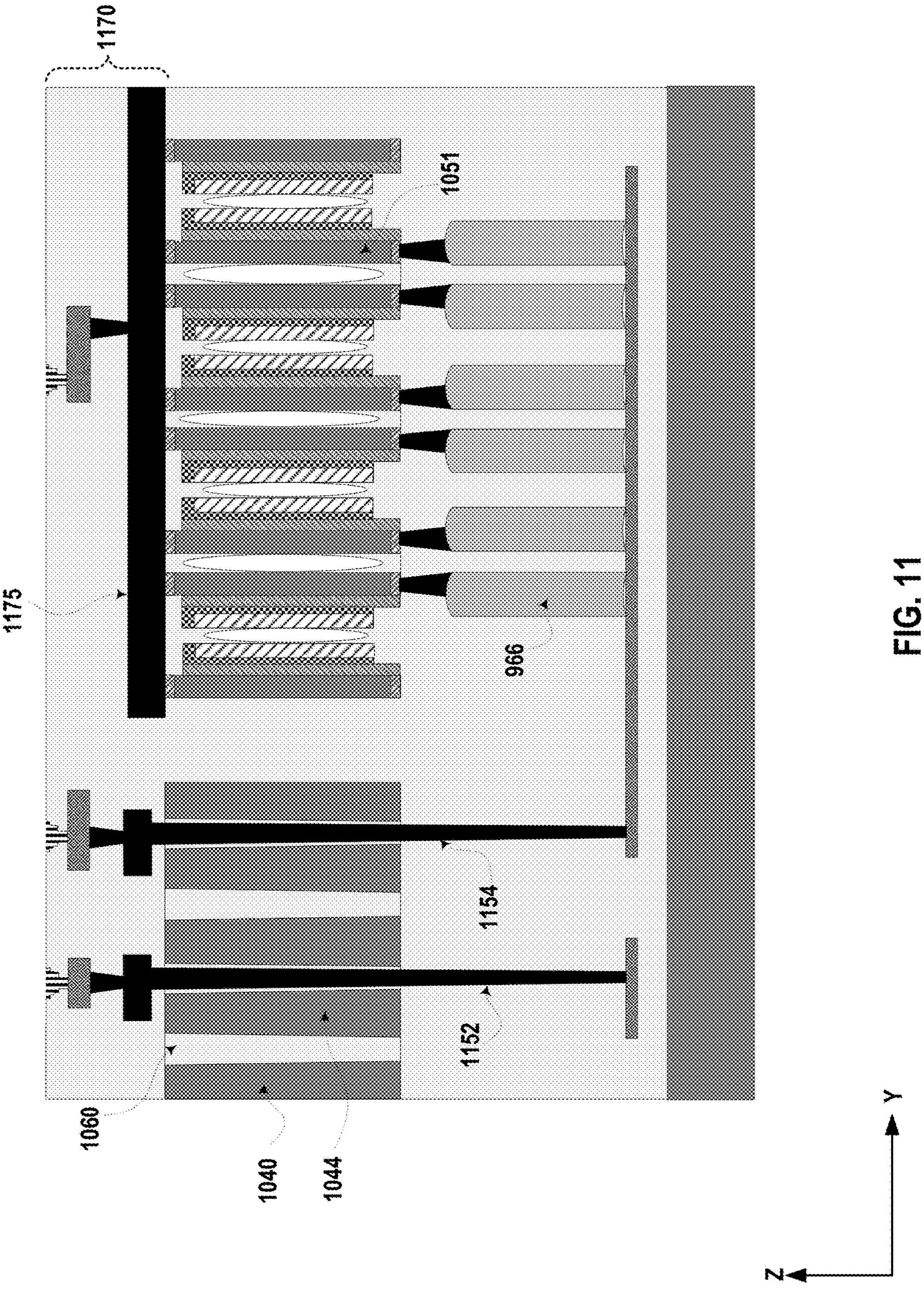

Referring back to FIG. 8, method 800 proceeds to operation 840, in which a first through contact can be formed to penetrate the floating semiconductor portion. In some implementations, operation 840 can further include forming a second through contact penetrating the periphery semiconductor portion outside of the isolation structures. In some implementations, operation 840 can further include forming an interconnect layer including bit lines above the array of memory cells. FIG. 11 illustrates a schematic side cross-sectional view of the 3D structure in the y-z plane after operation 840 of method 800.

As shown in FIG. 11, at least one first through contact 1152 can be formed to penetrate the floating semiconductor portion 1044 encircled by the isolation structure 1060. Further, at least one second through contact 1154 can be formed to penetrate the periphery semiconductor portion 1040 outside of the isolation structures 1060. In some implementations, the at least one first through contact 1152 and the at least one second through contact 1154 can be formed simultaneously by the same process. The at least one first through contact 1152 and the at least one second through contact 1154 can include conductive materials deposited by one or more thin film deposition processes including, but not limited to, CVD, PVD, ALD, electroplating, electroless plating, or any combination thereof. Fabrication processes to form at least one first through contact 1152 and the at least one second through contact 1154 can include photolithography, CMP, wet/dry etch, or any other suitable processes. The at least one first through contact 1152 and the at least one second through contact 1154 can be isolated from adjacent floating semiconductor portion 1044 or periphery semiconductor portion 1040 by a dielectric layer.

As illustrated in FIG. 11, an interconnect layer 1170 can be formed above memory cells 960. Interconnect layer 1170 can include interconnects of MEOL and/or BEOL in a plurality of ILD layers to make electrical connections with memory cells 960. In some implementations, interconnect layer 1170 includes multiple ILD layers, as well as interconnects, vias, and bonding pads therein formed in multiple processes. For example, the interconnects, vias, and bonding pads in interconnect layers 1170 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited using one or more thin film deposition processes including, but not limited to, CVD, PVD, ALD, or any combination thereof. The ILD layers and interconnects illustrated in FIG. 11 can be collectively referred to as interconnect layer 1170.

As illustrated in FIG. 11, forming the interconnect layer 1170 includes forming bit lines 1175 on the doped second ends of the vertical transistors 950. As illustrated in FIG. 11, bit line 1175 can be formed on the sources/drain (i.e., the upper end in FIG. 11) of the vertical transistors 950 by patterning and etching a trench aligned with the respective source/drain using lithography and etching processes and depositing conductive materials to fill the trench using thin film deposition processes. As a result, bit line 1175 and capacitor 966 can be formed on opposite sides of semiconductor body 1051 and coupled to opposite ends of semiconductor body 1051. It is understood that additional local interconnects, such as word line contacts, capacitor contacts, and bit line contacts may be similarly formed as well.

Figure 12:
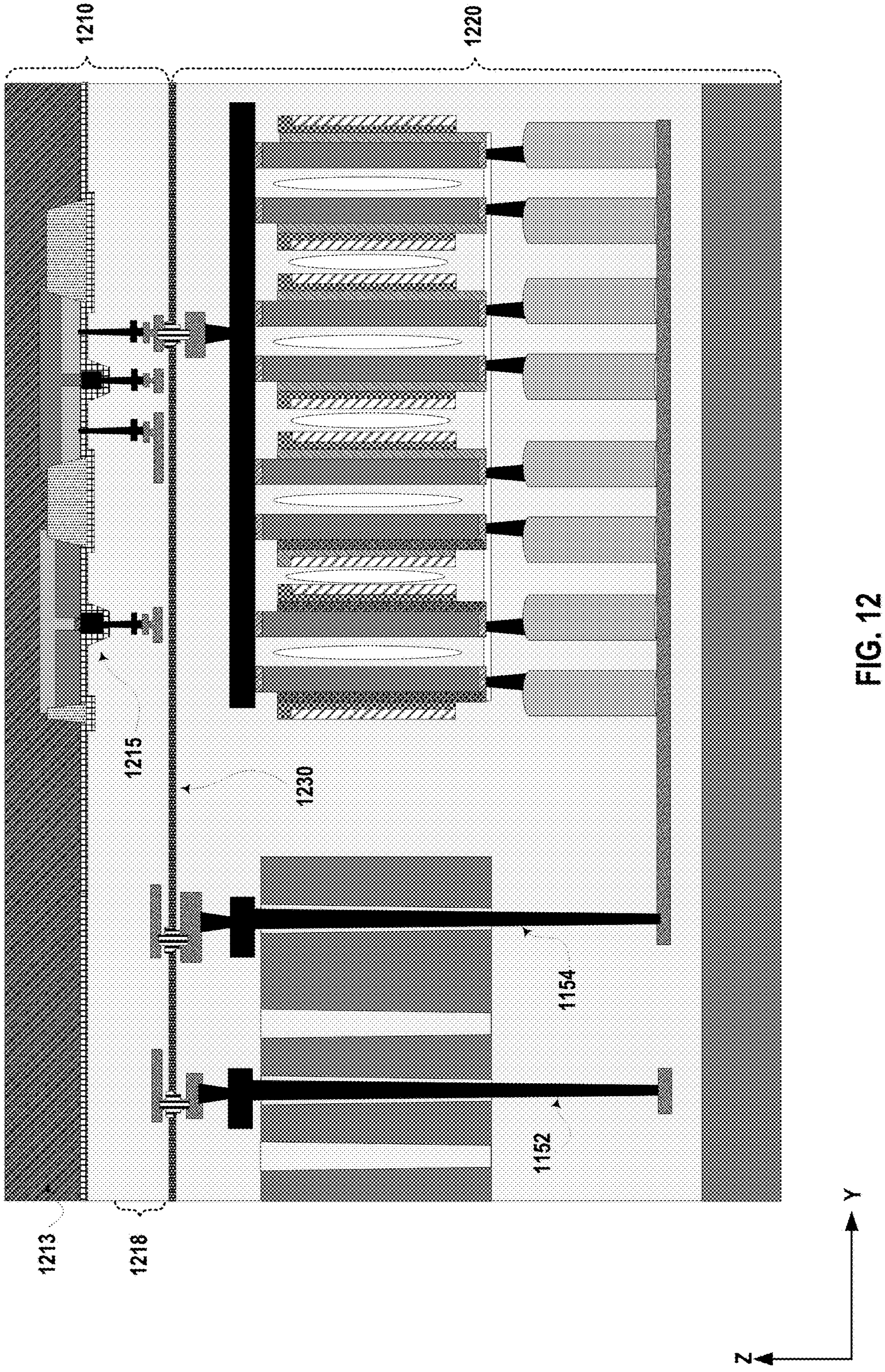

Method 800 proceeds to operation 850, as illustrated in FIG. 8, in which a circuit wafer can be bonded to the memory array wafer, such that the through contact is connected to a transistor in the circuit wafer. FIG. 12 illustrates a schematic side cross-sectional view of the 3D structure in the y-z plane after operation 850 of method 800.

As shown in FIG. 12, a circuit wafer 1210 including a peripheral circuit on a substrate 1213 can be provided. The peripheral circuit can comprise a plurality of transistors 1215 on the substrate 1213. The peripheral circuit can further comprise an interconnect layer 1218 including a plurality of interconnects, vias, and bonding contacts. The circuit wafer 1210 and the memory array wafer 1220 can be bonded in a face-to-face manner, such that the array of memory cells can be coupled to the peripheral circuit across a bonding interface 1230. The bonding can include hybrid bonding. In some implementations, the first through contact 1152 can be electrically connected to a transistor 1215 in the circuit wafer 1210. In some implementations, the second through contact 1154 can be electrically connected to a transistor 1215 in the circuit wafer 1210. In some implementations, the word lines and bits lines can be electrically connected to the peripheral circuit in circuit wafer 1210.

Figure 13:
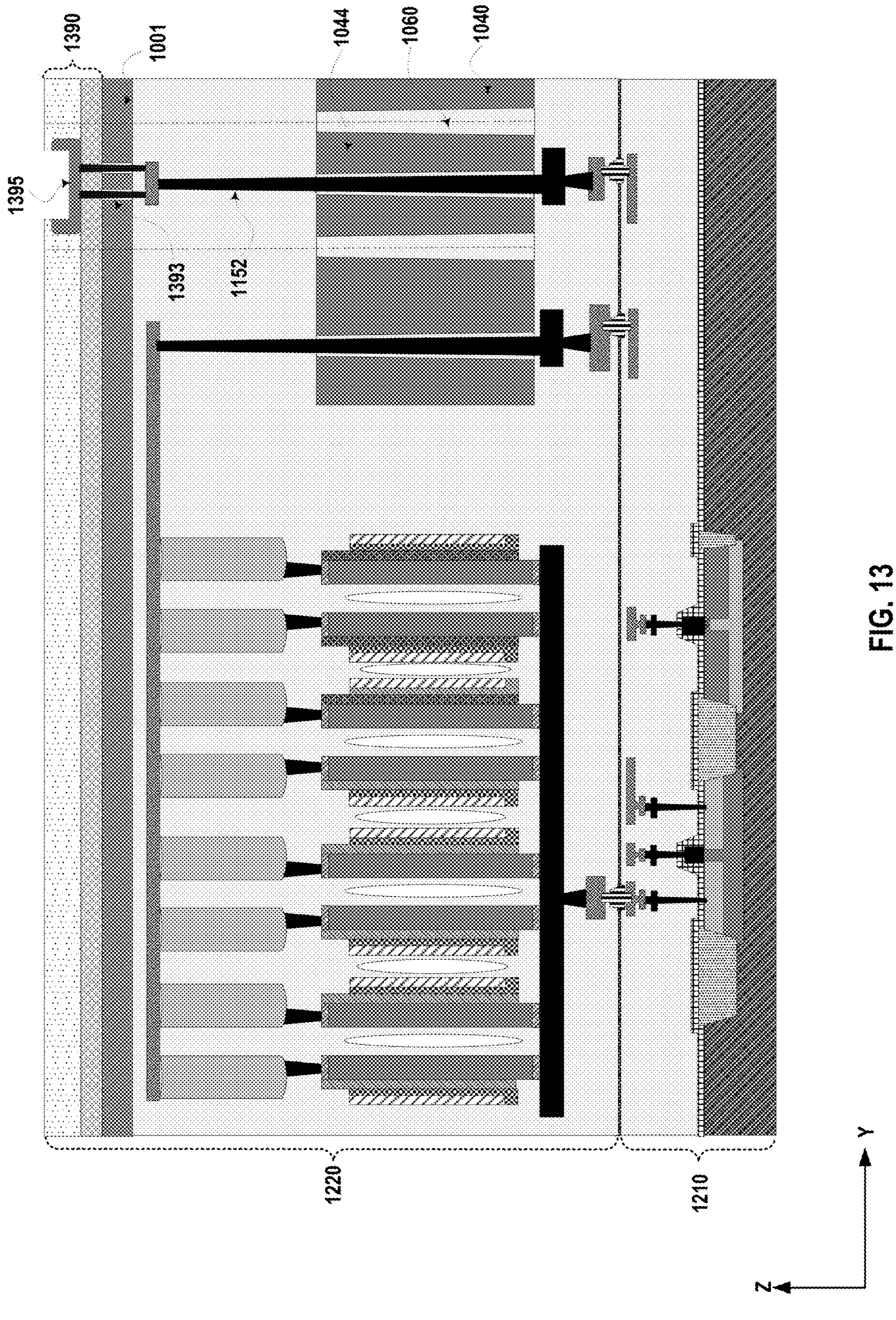

Method 800 proceeds to operation 860, as illustrated in FIG. 8, in which a contact pad can be formed on the memory array wafer. The contact pad can be connected to the first through contact. A lateral projection of the contact pad is within the isolation structure. FIG. 13 illustrates a schematic side cross-sectional view of the 3D structure in the y-z plane after operation 860 of method 800.

As shown in FIG. 13, a pad-out interconnect layer 1390 can be formed on the backside of the memory array wafer 1220. As illustrated in FIG. 13, a pad-out interconnect layer 1390 is formed on the backside of carrier substrate 1001. Pad-out interconnect layer 1390 can include interconnects, such as contact pads 1395, formed in one or more ILD layers. Contact pads 1395 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding, vias 1393 are formed extending vertically through carrier substrate 1001, for example, by wet/dry etching processes, followed by depositing conductive materials. Vias 1393 can be in electric connection with the first through contact 1152. It is understood that in some examples, carrier substrate 1001 may be thinned or removed after bonding and prior to forming pad-out interconnect layer 1390 and vias 1393, for example, using planarization processes and/or etching processes.

As shown in FIG. 13, a first lateral dimension of the contact pad 1395 can be smaller than a second lateral dimension of the floating semiconductor portion 1044 encircled by the isolation structure 1060. That is, a projection lateral of the contact pad 1395 on the lateral plane (x-y plane) can be within the isolation structure 1060. Due to the isolation structures 1060, the CIO between the periphery semiconductor portion 1040 and the contact pad 1395 can be reduced.

Figure 14:
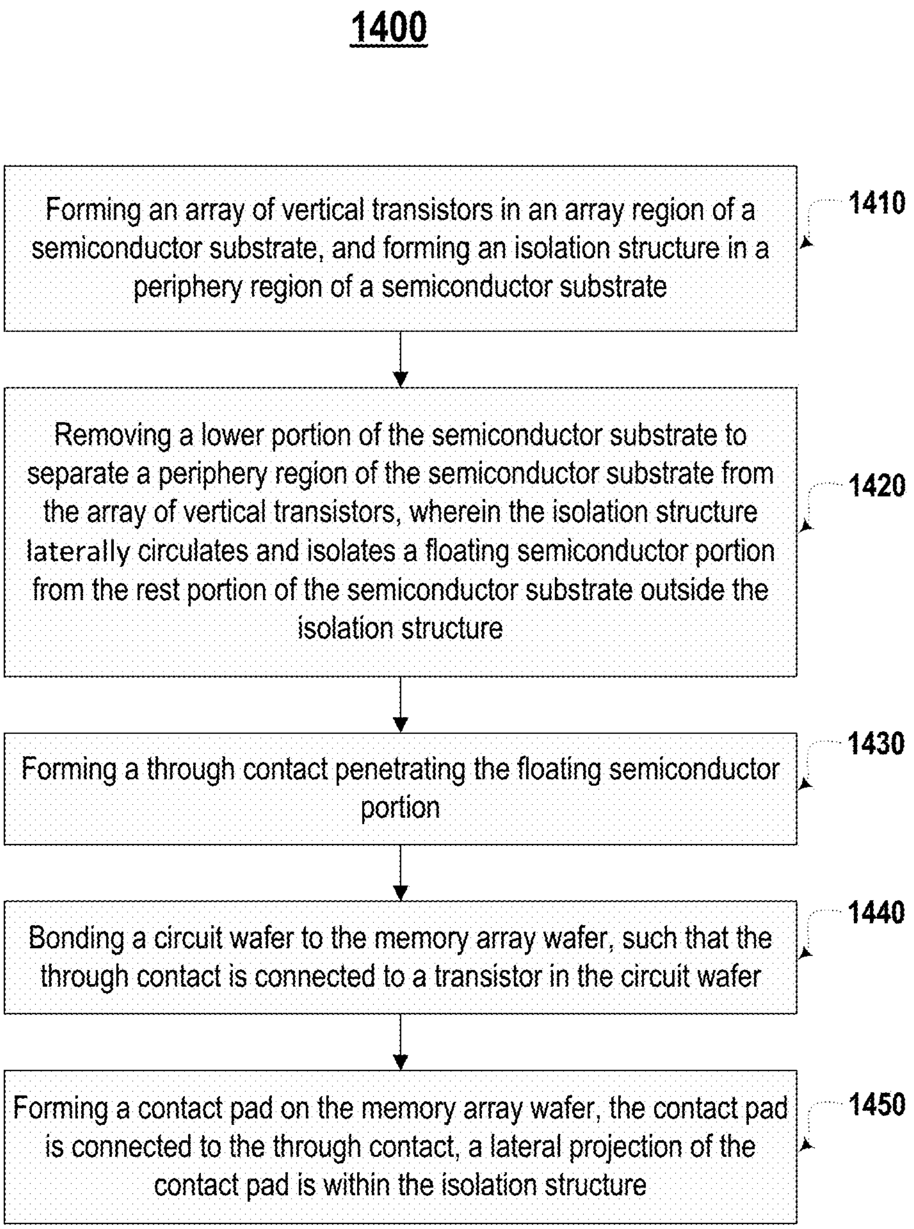
FIG. 14 illustrates a flowchart of a method for forming a 3D memory device, according to some aspects of the present disclosure.

FIG. 14 illustrates a flowchart of an exemplary fabricating method 1400 for forming a 3D memory device, according to some implementations of the present disclosure. FIGS. 15A-15B, and 16-19 illustrate schematic side cross-sectional views of an exemplary 3D memory device at certain fabricating stages of the method 1400 shown in FIG. 14, according to various implementations of the present disclosure. It is understood that the operations shown in method 1400 are not exhaustive and that other operations can be performed as well before, after, or between any of the illustrated operations. Further, some of the operations may be performed simultaneously, or in a different order than shown in FIG. 14.

Figure 15A:
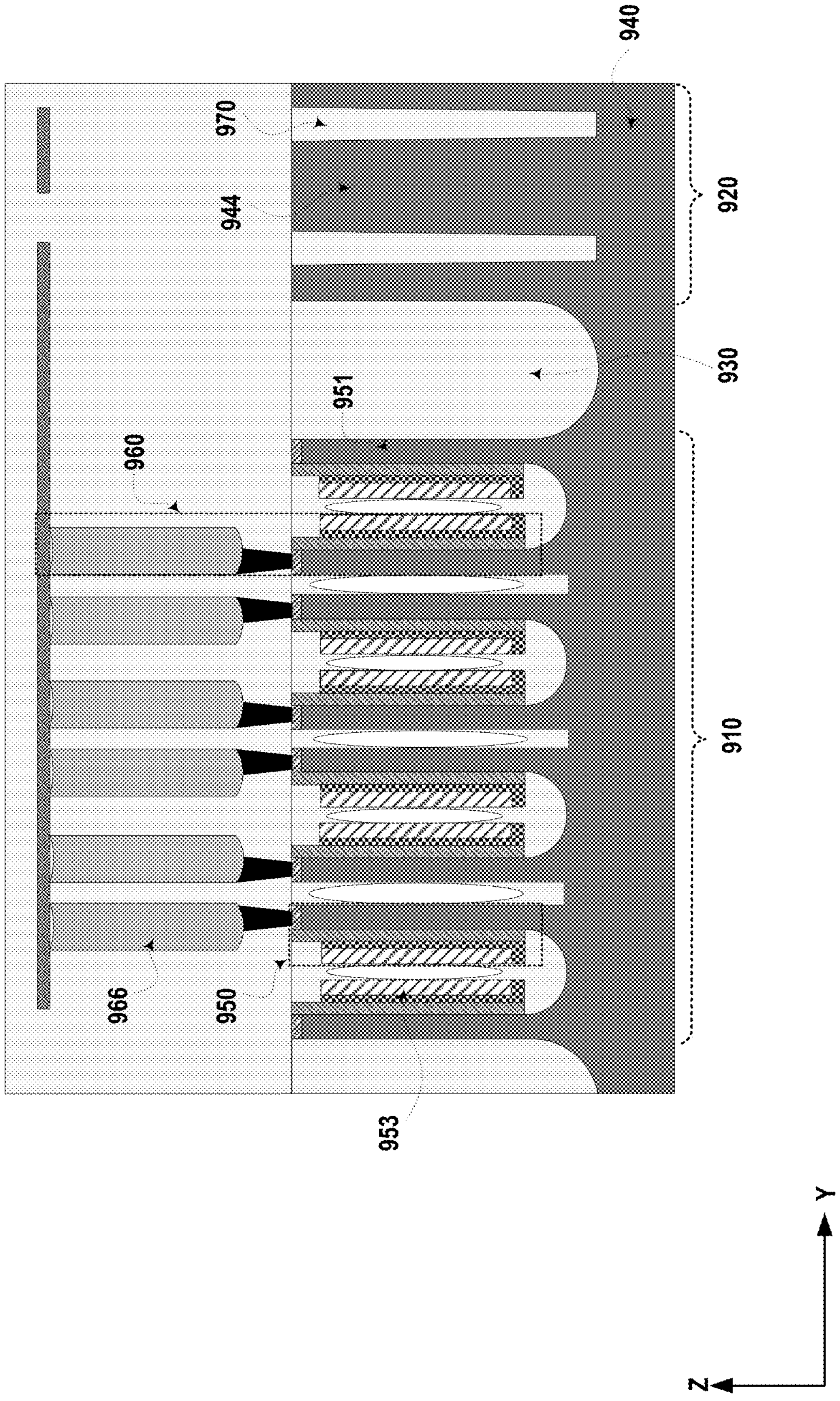
FIGS. 15A-15B and 16-19 illustrate a fabrication process for forming a 3D memory device, according to some aspects of the present disclosure.
Figure 15B:
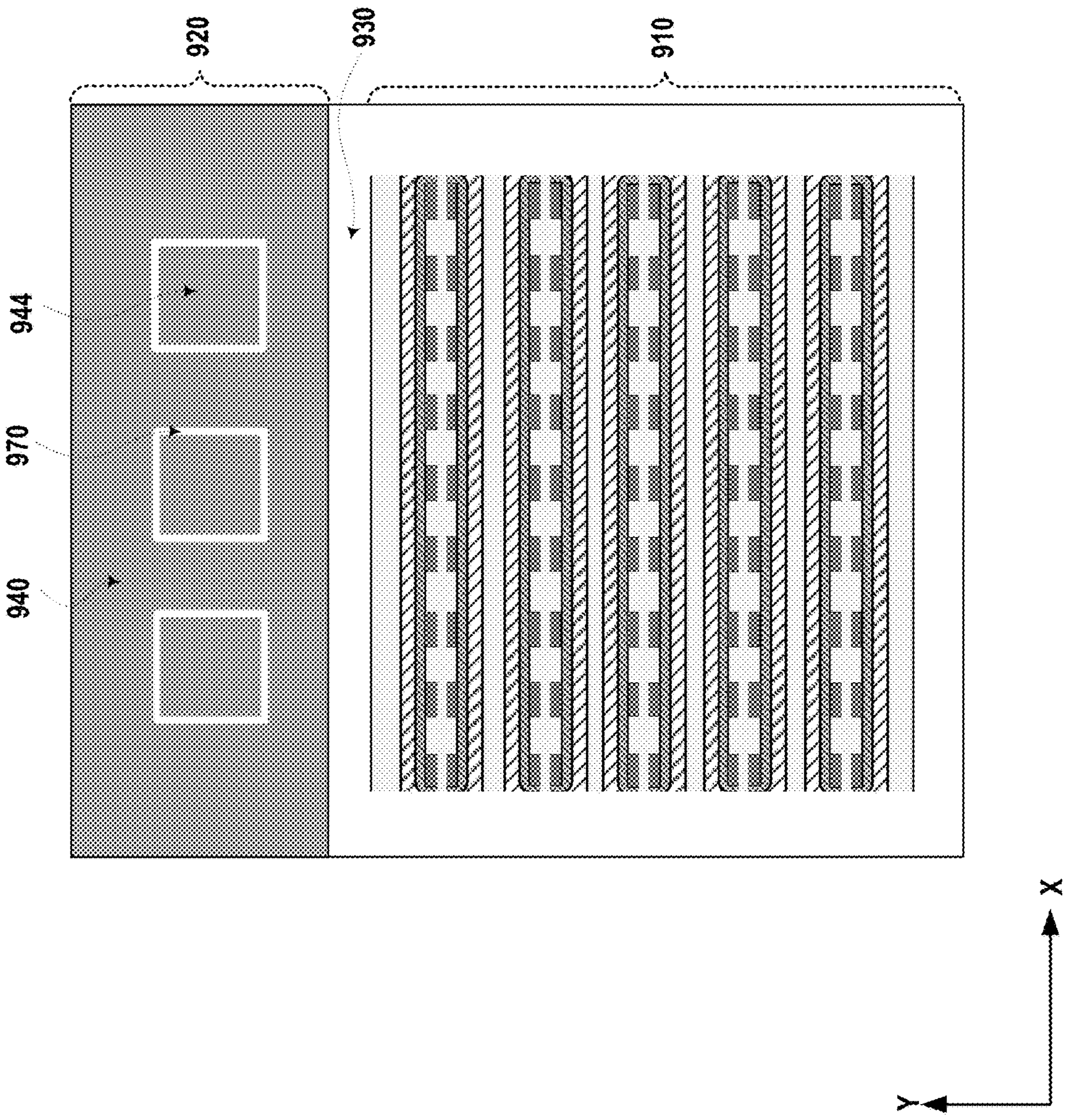

As shown in FIG. 14, method 1400 can start at operation 1410, in which an array of vertical transistors in an upper portion of a semiconductor substrate in an array region, and an isolation structure can be formed in an upper portion of a semiconductor substrate in a periphery region. In some implementations, operation 1410 further includes forming an array of memory cells including the array of vertical transistors. FIG. 15A illustrates a schematic side cross-sectional view of the 3D structure in the y-z plane after operation 1410 of method 1400. FIG. 15B illustrates a schematic plane view of the 3D structure along the x-y plane after operation 1410 of method 1400.

In some implementations as shown in FIGS. 15A and 15B, the array of memory cells 960 (e.g., DRAM cells) can include an array of vertical transistors 950 and an array of capacitors 966. The array of vertical transistors 950 can be formed in an upper portion of the semiconductor substrate 940 and in a memory array region 910. Each vertical transistor 950 can include a semiconductor pillar 951 extending vertically (in the z-direction) and have any suitable 3D shape, such as polyhedron shapes or a cylinder shape. That is, the cross-section of each semiconductor pillar 951 in the plan view (e.g., in the x-y plane) can have a square shape, a rectangular shape (or a trapezoidal shape), a circular shape, an oval shape, or any other suitable shapes.

In some implementations, forming the array of semiconductor pillars 951 can include forming a plurality of parallel first spacers extending along the first lateral direction (x-direction), and a plurality of parallel second spacers extending along the second lateral direction (y-direction). In some implementations, a lithography process is performed to pattern a plurality of first, second, and third trenches using an etch mask (e.g., a photoresist mask and/or a hard mask), and one or more dry etching and/or wet etching processes, such as RIE, are performed to etch the plurality of first and second trenches in an upper portion of the semiconductor substrate 940. Then the first spacers and second spacers can be formed by depositing a dielectric material, such as silicon oxide, to fill the first and second trenches, using a thin film deposition process including, but not limited to, CVD, PVD, ALD, or any combination thereof. The remaining upper portions of the semiconductor substrate 940 in the memory array region 910 can form the plurality of semiconductor pillars 951.

As shown in FIGS. 15A and 15B, a third spacer 930 can be formed in the upper portion of the semiconductor substrate 940 between the memory array region 910 and the periphery region 920 (also referred to as contact region). In some implementations, the third spacer 930 and the first trenches are formed in the same process when the third spacer 930 extends along the first lateral direction, and the third spacer 930 and the second trenches are formed in the same process when the third spacer 930 extends along the second lateral direction.

Further, an isolation structure vertically extending in the upper portion of the semiconductor substrate can be formed in the periphery region 920 to define a floating semiconductor portion laterally encircled by the isolation structure from the rest portion of the periphery semiconductor portion outside the isolation structure. As shown in FIGS. 15A and 15B, one or more isolation structures 970 vertically extending in the upper portion of the semiconductor substrate 940 can be formed in the periphery region 920 to define a floating semiconductor portion 944 laterally circulated by the isolation structure 970 from the rest portion of the semiconductor substrate 940 outside the isolation structure 970. In some implementations, a lithography process is performed to pattern a plurality of slits using an etch mask (e.g., a photoresist mask and/or a hard mask), and one or more dry etching and/or wet etching processes, such as RIE, are performed to etch the slits extending in the upper portion of the semiconductor substrate 940. Then the isolation structures 970 can be formed by depositing a dielectric material, such as silicon oxide, to fill the slits, using a thin film deposition process including, but not limited to, CVD, PVD, ALD, or any combination thereof. Each formed isolation structure 970 can have a ring-like shape in a lateral cross-sectional view. That is, each isolation structure 970 can encircle a portion of the semiconductor substrate 940 to define a floating semiconductor portion 944.

As shown in FIGS. 15A and 15B, forming the array of vertical transistors 950 can further include forming gate structures 953 embedded in the first spacers. In some implementations, each gate structure 953 can include a gate electrode and a gate dielectric layer between the gate electrode and the adjacent semiconductor pillar 951. The gate structures 953 of a row of vertical transistors 950 extending along the first lateral direction can be connected with each other to form a word line. In some implementations, forming the array of vertical transistors 950 can further include doping an end of each semiconductor pillar 951 by ion implantation and/or thermal diffusion to form a source/drain of each vertical transistor 950. As shown in FIGS. 15A and 15B, forming the array of memory cells 960 can further include forming the plurality of capacitors 966 each being electrically coupled with the source/drain of each semiconductor pillar 951.

Figure 16:
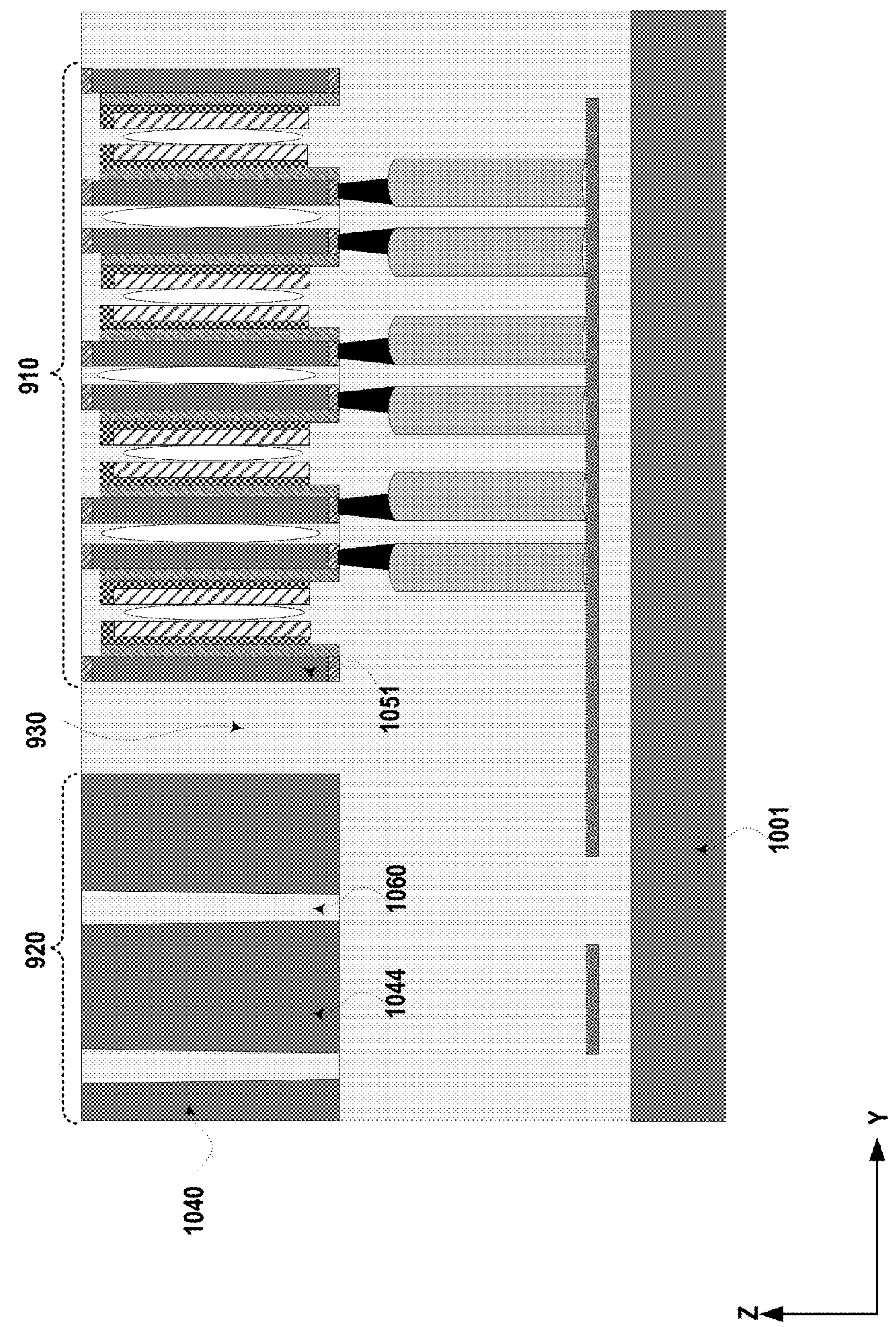

As shown in FIG. 14, method 1400 can proceed to operation 1420, in which a lower portion of the semiconductor substrate can be removed to separate a periphery region of the semiconductor substrate from the array of vertical transistors. The isolation structure laterally encircles and isolates the floating semiconductor portion from the rest of the semiconductor substrate outside the isolation structure. FIG. 16 illustrates a schematic side cross-sectional view of the 3D structure in the y-z plane after operation 1420 of method 1400.

As shown in FIG. 16, a carrier substrate 1001 can be formed on the 3D structure and then flipped over. Semiconductor substrate 940 can be thinned from the back side (top side in FIG. 16) by any suitable process, such as a chemical mechanical polishing (CMP) process. As such, the semiconductor pillars 951 in the memory array region 910 can be separated from each other to form a plurality of semiconductor bodies 1051, and the remaining portion of the semiconductor layer substrate 940 in the periphery region 920 can form a periphery semiconductor portion 1040 that is separated from the semiconductor bodies 1051 by the third spacer 930. Further, after thinning the semiconductor substrate 940, the floating semiconductor portion 1044 encircled by the isolation structure 1060 can be isolated from the periphery semiconductor portion 1040 of the semiconductor substrate outside the isolation structure 1060.

Further, as shown in FIG. 16, the exposed upper end of each semiconductor body 1051, i.e., one of the two ends of semiconductor body 1051 in the vertical direction (the z-direction) that is away from carrier substrate 1001, is doped to form another source/drain. In some implementations, an implantation process and/or thermal diffusion process are performed to dope P-type dopants or N-type dopants to exposed upper ends of semiconductor bodies 1051 to form sources/drains.

Figure 17:
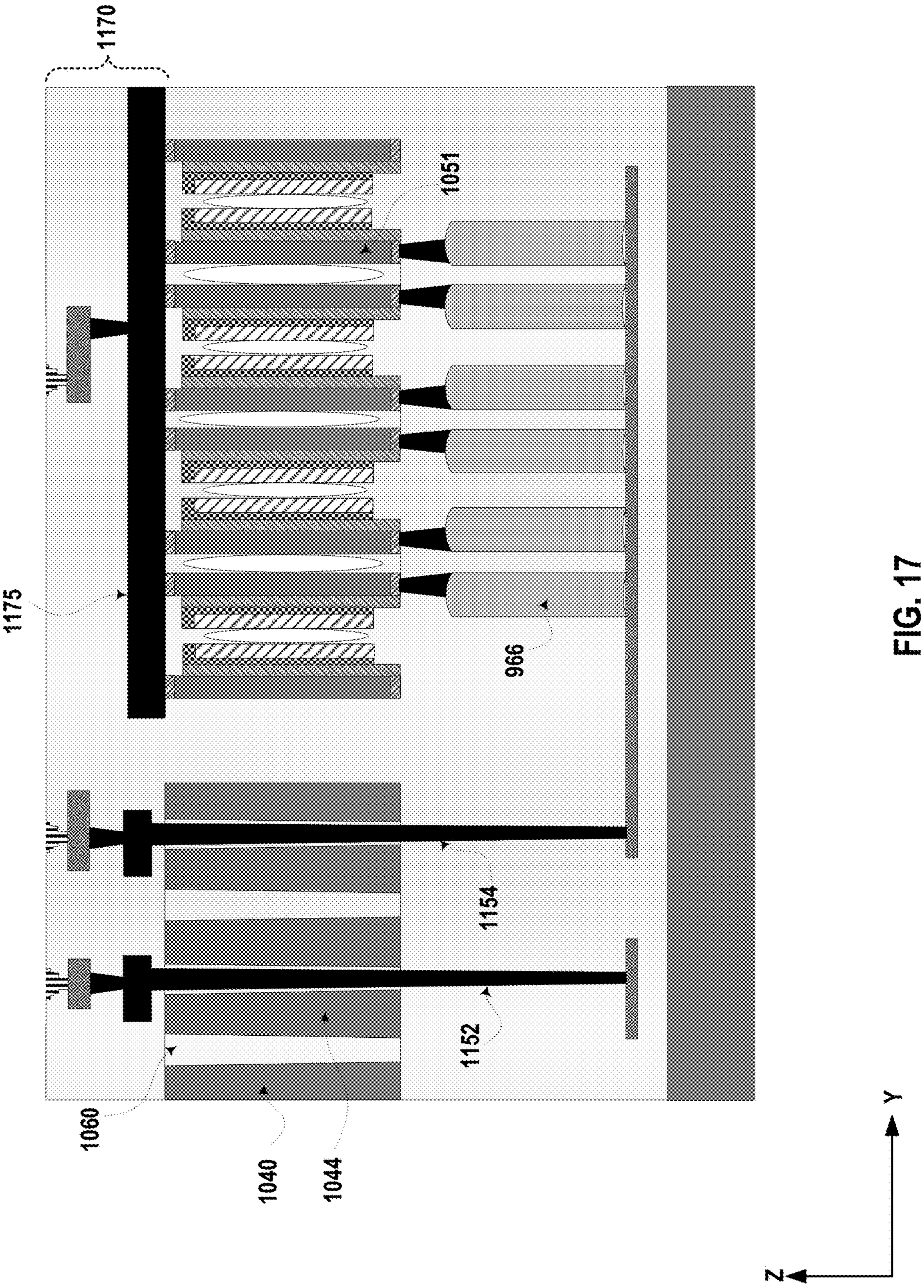

Referring back to FIG. 14, method 1400 proceeds to operation 1430, in which a first through contact can be formed to penetrate the floating semiconductor portion. In some implementations, operation 1430 can further include forming a second through contact penetrating the periphery semiconductor portion outside of the isolation structures. In some implementations, operation 1430 can further include forming an interconnect layer including bit lines above the array of memory cells. FIG. 17 illustrates a schematic side cross-sectional view of the 3D structure in y-z plane after operation 1430 of method 1400.

As shown in FIG. 17, at least one first through contact 1152 can be formed to penetrate the floating semiconductor portion 1044 encircled by the isolation structure 1060. Further, at least one second through contact 1154 can be formed to penetrate the periphery semiconductor portion 1040 outside of the isolation structures 1060. In some implementations, the at least one first through contact 1152 and the at least one second through contact 1154 can be formed simultaneously by the same process. The at least one first through contact 1152 and the at least one second through contact 1154 can include conductive materials deposited by one or more thin film deposition processes including, but not limited to, CVD, PVD, ALD, electroplating, electroless plating, or any combination thereof. Fabrication processes to form at least one first through contact 1152 and the at least one second through contact 1154 can include photolithography, CMP, wet/dry etch, or any other suitable processes. The at least one first through contact 1152 and the at least one second through contact 1154 can be isolated from adjacent floating semiconductor portion 1044 or periphery semiconductor portion 1040 by a dielectric layer.

As illustrated in FIG. 17, an interconnect layer 1170 can be formed above memory cells 960. Interconnect layer 1170 can include interconnects of MEOL and/or BEOL in a plurality of ILD layers to make electrical connections with memory cells 960. In some implementations, interconnect layer 1170 includes multiple ILD layers, as well as interconnects, vias, and bonding pads therein formed in multiple processes. For example, the interconnects, vias, and bonding pads in interconnect layers 1170 can include conductive materials deposited by one or more thin film deposition processes including, but not limited to, CVD, PVD, ALD, electroplating, electroless plating, or any combination thereof. Fabrication processes to form the interconnects can also include photolithography, CMP, wet/dry etch, or any other suitable processes. The ILD layers can include dielectric materials deposited using one or more thin film deposition processes including, but not limited to, CVD, PVD, ALD, or any combination thereof. The ILD layers and interconnects illustrated in FIG. 17 can be collectively referred to as interconnect layer 1170.

As illustrated in FIG. 17, forming the interconnect layer 1170 includes forming bit lines 1175 on the doped second ends of the vertical transistors 950. As illustrated in FIG. 17, bit line 1175 can be formed on the sources/drain (i.e., the upper end in FIG. 17) of the vertical transistors 950 by patterning and etching a trench aligned with respective source/drain using lithography and etching processes and depositing conductive materials to fill the trench using thin film deposition processes. As a result, bit line 1175 and capacitor 966 can be formed on opposite sides of semiconductor body 1051 and coupled to opposite ends of semiconductor body 1051. It is understood that additional local interconnects, such as word line contacts, capacitor contacts, and bit line contacts may be similarly formed as well.

Figure 18:
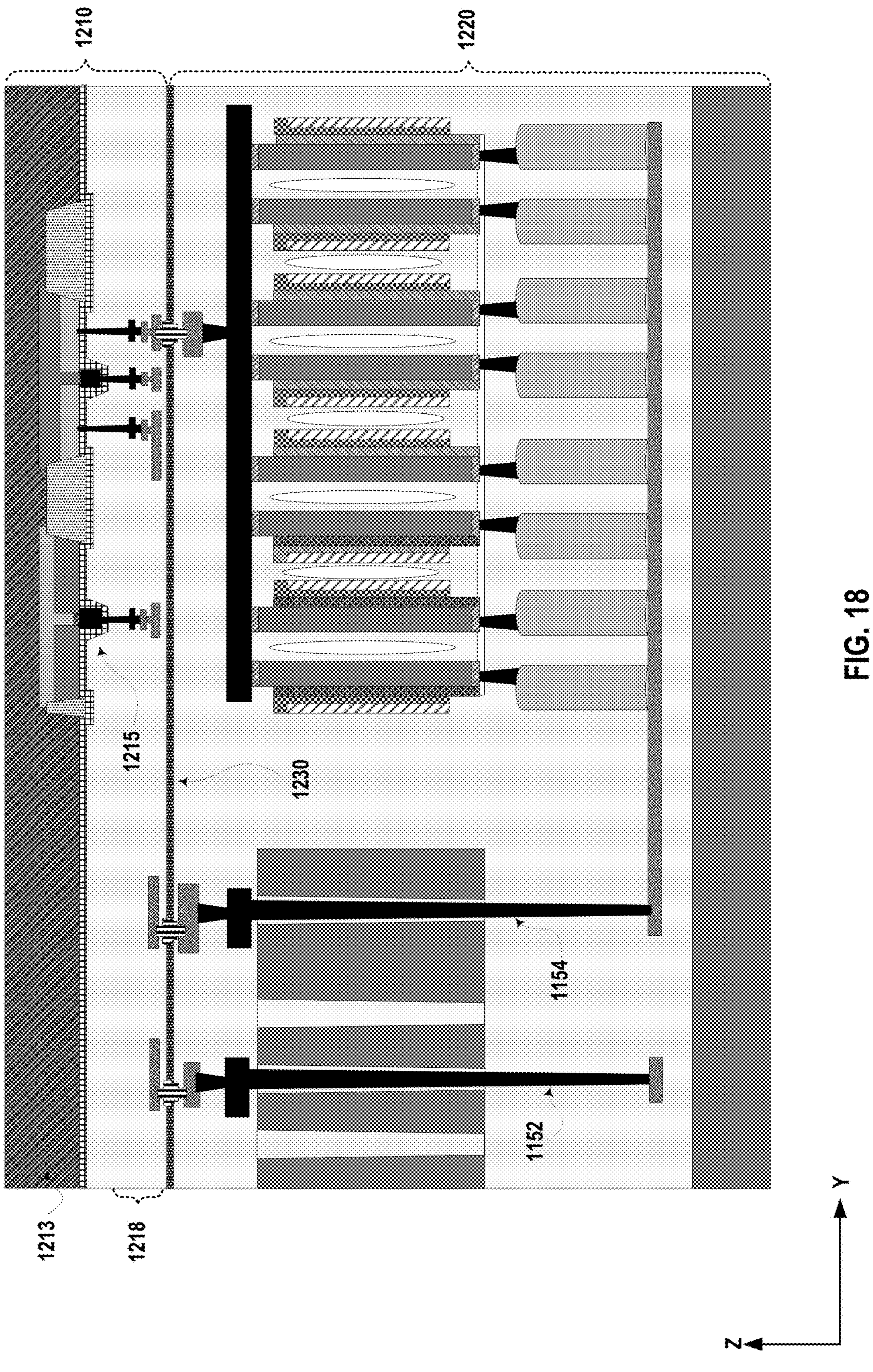

Method 1400 proceeds to operation 1440, as illustrated in FIG. 14, in which a circuit wafer can be bonded to the memory array wafer, such that the through contact is connected to a transistor in the circuit wafer. FIG. 18 illustrates a schematic side cross-sectional view of the 3D structure in the y-z plane after operation 1440 of method 1400.

As shown in FIG. 18, a circuit wafer 1210 including a peripheral circuit on a substrate 1213 can be provided. The peripheral circuit can comprise a plurality of transistors 1215 on the substrate 1213. The peripheral circuit can further comprise an interconnect layer 1218 including a plurality of interconnects, vias, and bonding contacts. The circuit wafer 1210 and the memory array wafer 1220 can be bonded in a face-to-face manner, such that the array of memory cells can be coupled to the peripheral circuit across a bonding interface 1230. The bonding can include hybrid bonding. In some implementations, the first through contact 1152 can be electrically connected to a transistor 1215 in the circuit wafer 1210. In some implementations, the second through contact 1154 can be electrically connected to a transistor 1215 in the circuit wafer 1210. In some implementations, the word lines and bits lines can be electrically connected to the peripheral circuit in circuit wafer 1210.

Figure 19:
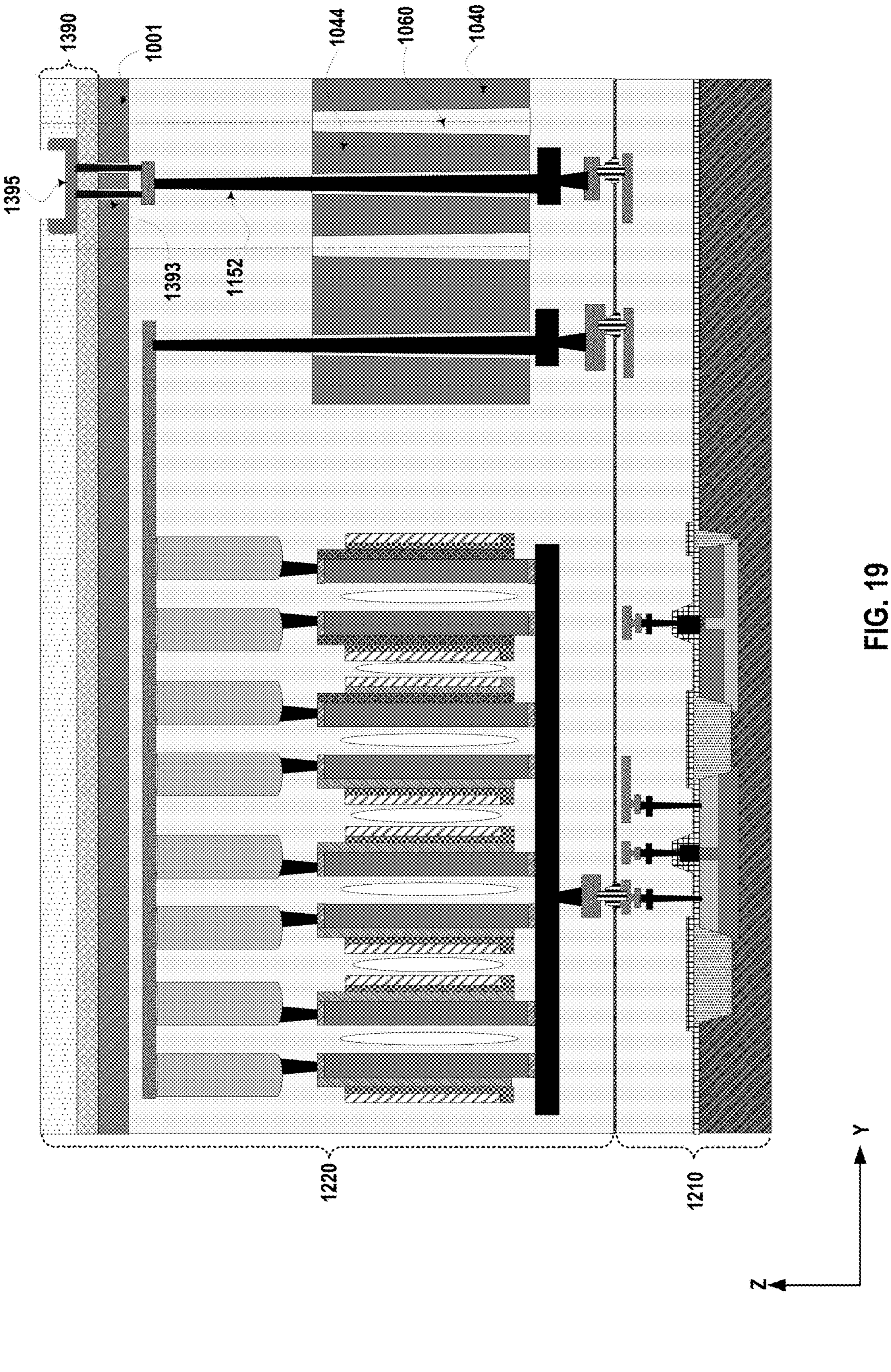

Method 1400 proceeds to operation 1450, as illustrated in FIG. 14, in which a contact pad can be formed on the memory array wafer. The contact pad can be connected to the first through contact. A lateral projection of the contact pad is within the isolation structure. FIG. 19 illustrates a schematic side cross-sectional view of the 3D structure in the y-z plane after operation 1450 of method 1400.

As shown in FIG. 19, a pad-out interconnect layer 1390 can be formed on the backside of the memory array wafer 1220. As illustrated in FIG. 19, a pad-out interconnect layer 1390 is formed on the backside of carrier substrate 1001. Pad-out interconnect layer 1390 can include interconnects, such as contact pads 1395, formed in one or more ILD layers. Contact pads 1395 can include conductive materials including, but not limited to, W, Co, Cu, Al, doped silicon, silicides, or any combination thereof. The ILD layers can include dielectric materials including, but not limited to, silicon oxide, silicon nitride, silicon oxynitride, low-k dielectrics, or any combination thereof. In some implementations, after the bonding, vias 1393 are formed extending vertically through carrier substrate 1001, for example, by wet/dry etching processes, followed by depositing conductive materials. Vias 1393 can be in electric connection with the first through contact 1152. It is understood that in some examples, carrier substrate 1001 may be thinned or removed after bonding and prior to forming pad-out interconnect layer 1390 and vias 1393, for example, using planarization processes and/or etching processes.

As shown in FIG. 19, a first lateral dimension of the contact pad 1395 can be smaller than a second lateral dimension of the floating semiconductor portion 1044 encircled by the isolation structure 1060. That is, a projection lateral of the contact pad 1395 on the lateral plane (x-y plane) can be within the isolation structure 1060. Due to the isolation structures 1060, the CIO between the periphery semiconductor portion 1040 and the contact pad 1395 can be reduced.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A semiconductor device, comprising:

a memory structure comprising:

first transistors each comprising a semiconductor body extending in a vertical direction, a semiconductor layer on a lateral side of the first transistors, a first isolation structure extending through the semiconductor layer and laterally encircling a first portion of the semiconductor layer, a first contact structure extending through the first portion of the semiconductor layer, and a first contact pad above the first portion of the semiconductor layer and connected with the first contact structure, wherein a lateral dimension of the first contact pad is less than a lateral dimension of the first portion of the semiconductor layer; and a circuit structure comprising a second transistor, wherein the circuit structure is bonded with the memory structure, the first contact pad is electrically connected to the second transistor by the first contact structure.

2. The semiconductor device of claim 1, wherein:

a lateral cross section of the first isolation structure is a ring.

3. The semiconductor device of claim 1, wherein the memory structure further comprises:

a second isolation structure extending through the semiconductor layer and laterally encircling a second portion of the semiconductor layer;

a second contact structure extending through the second portion of the semiconductor layer; and a second contact pad above the second portion of the semiconductor layer and connected with the second contact structure, wherein a lateral dimension of the second contact pad is less than a lateral dimension of the second portion of the semiconductor layer.

4. The semiconductor device of claim 3, wherein:

the first isolation structure is separated from the second isolation structure.

5. The semiconductor device of claim 3, wherein:

the first isolation structure and the second isolation structure share a common isolation wall.

6. The semiconductor device of claim 1, wherein the memory structure further comprises:

word lines each extending along a first lateral direction and comprising a plurality of gate structures of a row of the first transistors arranged in the first lateral direction; and bit lines each extending along a second lateral direction different from the first lateral direction and connected to a column of the first transistors arranged in the second lateral direction.

7. The semiconductor device of claim 6, wherein the memory structure further comprises:

storage units each connected with a corresponding first transistor.

8. The semiconductor device of claim 7, wherein:

the storage units are capacitors.

9. The semiconductor device of claim 7, wherein:

the first transistor comprises a vertical semiconductor body, the vertical semiconductor body comprising:

a first end connected with one storage unit; and a second end connected with one bit line.

10. The semiconductor device of claim 7, wherein the memory structure further comprises:

a third contact structure extending through the semiconductor layer outside the first isolation structure, and connected with a conductive layer in electric connection with the storage units.

11. A memory system, comprising:

a memory device comprising a memory structure coupled with a circuit structure, wherein:

the memory structure comprises:

first transistors each comprising a semiconductor body extending in a vertical direction, a semiconductor layer on a lateral side of the first transistors, a first isolation structure extending through the semiconductor layer and laterally encircling a portion of the semiconductor layer, a first contact extending through the portion of the semiconductor layer encircled by the isolation structure, and a first contact pad above the portion of the semiconductor layer and connected with the contact, wherein a lateral dimension of the contact pad is less than a lateral dimension of the portion of the semiconductor layer;

the circuit structure comprises a second transistor electrically connected to the first contact pad by the first contact; and a memory controller connected to the first contact pad and configured to control the memory device through the first contact pad.

12. The memory system of claim 11, wherein:

a lateral cross section of the first isolation structure is a ring.

13. The memory system of claim 11, wherein the memory structure further comprises:

a second isolation structure extending through the semiconductor layer and laterally encircling a second portion of the semiconductor layer;

a second contact structure extending through the second portion of the semiconductor layer; and a second contact pad above the second portion of the semiconductor layer and connected with the second contact structure, wherein a lateral dimension of the second contact pad is less than a lateral dimension of the second portion of the semiconductor layer.

14. The memory system of claim 13, wherein:

the first isolation structure is separated from the second isolation structure.

15. The memory system of claim 13, wherein:

the first isolation structure and the second isolation structure share a common isolation wall.

16. The memory system of claim 11, wherein the memory structure further comprises:

word lines each extending along a first lateral direction and comprising a plurality of gate structures of a row of the first transistors arranged in the first lateral direction; and bit lines each extending along a second lateral direction different from the first lateral direction and connected to a column of the first transistors arranged in the second lateral direction.

17. The memory system of claim 16, wherein the memory structure further comprises:

storage units each connected with a corresponding first transistor.

18. The memory system of claim 17, wherein:

the storage units are capacitors.

19. The memory system of claim 17, wherein:

the first transistor comprises a vertical semiconductor body, the vertical semiconductor body comprising:

a first end connected with one storage unit; and a second end connected with one bit line.

20. The memory system of claim 17, wherein the memory structure further comprises:

a third contact structure extending through the semiconductor layer outside the first isolation structure, and connected with a conductive layer in electric connection with the storage units.

* * * * *